United States Patent [19]
Kumanoya et al.

[11] Patent Number: 4,961,167
[45] Date of Patent: Oct. 2, 1990

[54] SUBSTRATE BIAS GENERATOR IN A DYNAMIC RANDOM ACCESS MEMORY WITH AUTO/SELF REFRESH FUNCTIONS AND A METHOD OF GENERATING A SUBSTRATE BIAS THEREIN

[75] Inventors: Masaki Kumanoya; Yasuhiro Konishi; Katsumi Dosaka; Takahiro Komatsu; Yoshinori Inoue, all of Hyogo, Japan

[73] Assignee: Mitsubishi Denki Kabushiki Kaisha, Tokyo, Japan

[21] Appl. No.: 381,347

[22] Filed: Jul. 18, 1989

[30] Foreign Application Priority Data

Aug. 26, 1988 [JP] Japan .................. 63-213204
Dec. 8, 1988 [JP] Japan .................. 63-312416

[51] Int. Cl.$^5$ .......................................... G11C 11/403
[52] U.S. Cl. ................................ 365/189.09; 365/222; 307/296.2
[58] Field of Search ................ 365/222, 189.09; 307/296.2

[56] References Cited

U.S. PATENT DOCUMENTS

| | | | |
|---|---|---|---|
| 4,839,867 | 6/1989 | Poehnitzsch | 365/222 |
| 4,849,936 | 7/1989 | Mizutani | 365/222 |
| 4,887,240 | 12/1989 | Garverick et al. | 365/222 |

FOREIGN PATENT DOCUMENTS 61-59688 3/1986 Japan .
88-04306 6/1989 World Int. Prop. O. ....... 307/296.2

OTHER PUBLICATIONS

Yamada et al., "A 64K Bit MOS Dynamic RAM with Auto/Self Refresh Functions", The Transactions of the Institute of Electronics and Communication Engineers, Japan, vol. J66-C, No. 1, Jan. 1983, pp. 62-69.
Taniguchi et al., "Fully Boosted 64K Dynamic RAM wit Automatic and Self-Refresh" IEEE Journal of Solid State Circuits, vol. SC-16, No. 5, Oct. 1981, pp. 492-498.

Primary Examiner—Joseph E. Clawson, Jr.
Attorney, Agent, or Firm—Lowe, Price, LeBlanc, Becker & Shur

[57] ABSTRACT

A dynamic random access memory with self-refresh function, which includes a substrate bias generator (100) adapted to be intermittently driven to apply a bias potential to a semiconductor substrate (15). This memory device comprises a circuit (91) for generating an internal refresh instruction signal ($\phi_S$) in response to an external refresh instruction signal, a circuit (92, 93) which, in response to the internal refresh instruction signal, generates a refresh enable signal ($\phi_R$) intermittently at a predetermined interval, a circuit (94, 95, 96, 98) which, in response to the refresh enable signal, refreshes data in the memory cells, and a circuit (99) which, in response to the internal refresh instruction signal and refresh enable signal, activates the substrate bias generator in the same cycle as the cycle of generation of the refresh enable signal and only for a time shorter than the cycle of generation of the refresh enable signal. The above construction contributes to a reduced power consumption in the dynamic random access memory.

24 Claims, 23 Drawing Sheets

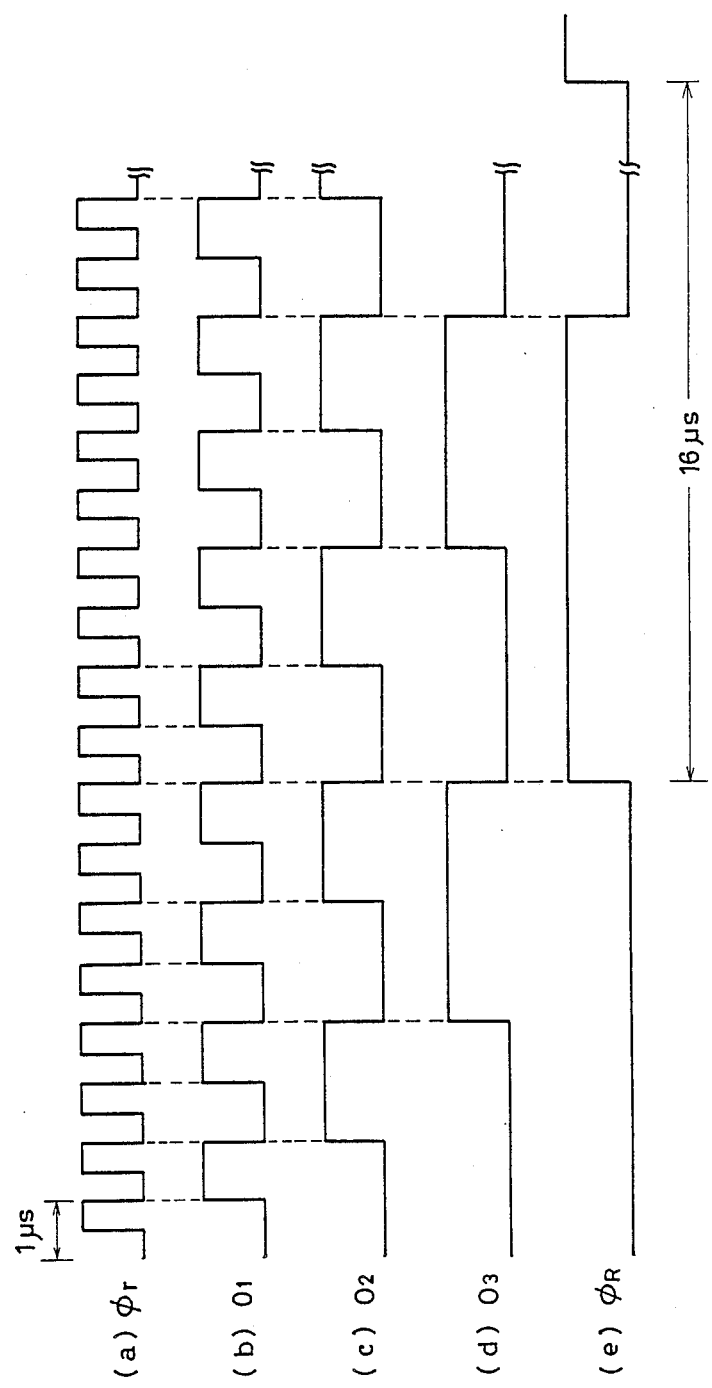

SUBSTRATE BIAS GENERATOR IN A DYNAMIC RANDOM ACCESS MEMORY WITH AUTO/SELF REFRESH FUNCTIONS AND A METHOD OF GENERATING A SUBSTRATE BIAS THEREIN

BACKGROUND OF THE INVENTION

1. Field of the Invention

This invention relates generally to a dynamic random access memory with self-refresh function and particularly to a system and a method for reducing the consumption power of such a dynamic random access memory. More particularly, this invention relates to the construction of a substrate bias generating circuit and a method of generating a bias voltage, by which the necessary substrate bias potential can be generated with a minimum of consumption power on the refresh mode.

2. Brief Description of the Background Art

Recent years have seen a remarkable spread in the use of personal computers in a broad range of applications. among such personal computers, portable models in particular are in great demand, and for use in such portable personal computers, a low-power-consuming memory device with battery backup mode is being demanded.

As such a memory device, usually a dynamic random access memory (DRAM) or a static random access memory (SRAM) has been employed. Of these devices, the DRAM operates on the principle of accumulating the information charge in a MOS capacitor (a capacitor comprising a metal layer as an electrode, a semiconductor layer as the other electrode and an interlayer layer insulating film as a dielectric layer). However, in the MOS capacitor, the accumulated charge is gradually lost due to leaks across the junction between the semiconductor region, which serves as said other electrode, and the semiconductor substrate, thus making it necessary to rewrite the stored information at timed intervals. Such a rewriting action is known as refreshing. When a DRAM is used as the memory of a portable personal computer, it is necessary to perform refreshing at timed intervals even on a battery backup mode.

The general refresh modes for the DRAM are $\overline{RAS0}$ only refresh and $\overline{CAS0}$ before $\overline{RAS0}$ refresh. The $\overline{RAS0}$ only refresh is the refresh mode in which an external row address for refresh (refresh address) is applied and the level of row address strobe signal $\overline{RAS0}$ is lowered to bring the DRAM into a selectable state. In this $\overline{RAS0}$ only refresh, the column address strobe signal $\overline{CAS0}$ is held at "H" level. The $\overline{CAS0}$ before $\overline{RAS0}$ refresh is the refresh mode in which, before the level of signal $\overline{RAS0}$ is decreased to "L" level, the signal $\overline{CAS0}$ is first decreased to "L" level so that a refresh instruction signal is issued to let an automatic refresh proceed according to the state of this signal. On whichever of these general refresh modes, refreshing is executed under the cycle-by-cycle control of external clocks such as the signals $\overline{RAS0}$ and $\overline{CAS}$ Therefore, the use of such general refresh mode during battery backup would call for complicate control which is undesirable.

To overcome the above disadvantage there has been proposed and put to use a DRAM with an implementation enabling a refresh of stored data to be easily performed even in the battery backup mode. This DRAM has, a refresh address and a timer circuit for designating the timing of refresh for each row and has a self-refresh function such that refreshes are automatically executed under the control of the timer circuit. While the above DRAM with self-refresh function has been described in detail by Yamada et al. in "A 64K bit MOS Dynamic RAM with Auto/Self Refresh Functions," The Transactions of the Institute of Electronics and Communication Engineers, Japan, Vol, J66-C No. 1, January 1983, pp 62-69", a brief overview of the DRAM is presented below.

FIG. 1 is a block diagram showing a typical construction of the conventional 64K bit DRAM with self-refresh function. In this figure, only the elements and components relevant to refresh action are shown. Referring to FIG. 1, the DRAM comprises a memory array 97 including memory cells arranged in 256 ($2^8$) rows x 256 ($2^8$) columns, an address buffer 96 which receives an address signal from an address multiplexer 95, holds it temporarily and generates an internal row address signal, and a row decoder 98 which, in response to the internal row address signal from the address buffer 96, selects the corresponding one row out of the memory array 97. The address buffer 96 supplies a 7-bit internal address signal RA0–RA6 to the row decoder 98. Though not shown in detail, the memory array 97 is divided into two blocks of 128 rows x 256 columns each, and from these two blocks, two word lines are simultaneously selected by the signal RA0–RA6, that is, one word line from each block. The most significant address signal RA7 from the address buffer 96 is used as a block selection address signal.

The address multiplexer 95 receives a row address signal A0–A7 from an external device and a refresh Q0–Q6 from a refresh address counter 94 and feeds either one of these signals to the address buffer 96 under the control of a refresh controller 92. As the external address signal A0–A7, a row address signal and a column address signal are subjected to time-divisional multiplexing and supplied to the address multiplexer 95.

For the purpose of designating the refresh mode of the DRAM, the memory further includes a self-refresh mode detector 91 which receives a signal $\overline{REF0}$ via an input terminal 1 and detects whether there exists a designation of the self-refresh mode and refresh controller 92 which, in response to an output of a self-refresh mode detector 91, generates signals for controlling the actions of the address multiplexer 95, refresh address counter 94 and timer 93. The address multiplexer 95, in response to a refresh instruction signal from the refresh controller 92, supplies a refresh address Q0–Q6 from the refresh address counter 94 to the address buffer 96.

The timer 93, in response to the refresh instruction signal $\phi_T$ from the refresh controller 92, outputs a refresh mode enable signal $\phi_R$ at a predetermined interval. The refresh address counter 94, in response to the refresh enable signal $\phi_R$ from the timer 93, increments its count and supplies the address multiplexer 95 with the refresh address Q0–Q6 corresponding to the count under the control of the refresh controller 92. The action of the DRAM thus constructed is briefly explained below.

The signal $\overline{RAS0}$ fed to an input terminal 2 is held at "H" level (standby state) and the external refresh signal $\overline{REF0}$ fed to the input terminal 1 is set to "L" level. In response to this state, the self-refresh mode detector 91 detects that a refresh is instructed and accordingly outputs a refresh instruction signal $\phi_S$. In response to this refresh instruction signal $\phi_S$, the address multiplexer 95 supplies a refresh address Q0–Q6 from the refresh address counter 94 to the address buffer 96 under the control of the refresh controller 92. The address buffer 96 generates an internal refresh address signal RA0—RA6 from the refresh address Q0-Q6 and supplies it to the row decoder 98. The row decoder 98 decodes this 7-bit refresh address Q0-Q6 and selects one row out of the 128 rows in each block of the memory array 97. Then, a refresh of data is carried out in the memory cells connected to the selected row in a usual manner.

When the external refresh signal $\overline{REF0}$ remains at "L" level for more than a preset time (16 μs at maximum), the designation of the self-refresh mode is detected by the self-refresh mode detector 91. In response to this detection of the designation of the self-refresh mode, the refresh controller 92 raises the level of signal $\phi_T$ to drive the timer 93. In response to this timer start signal $\phi_T$, the timer 93 outputs a refresh enable signal $\phi_R$ upon lapse of the preset time (16 μs maximum) to the refresh controller 92. In response to this refresh enable signal $\phi_R$, the refresh controller 92 performs an incrementation of the count of the refresh address counter 94. In response, the refresh address counter 94 supplies the address multiplexer 95 with a refresh address Q0-Q6 different from the refresh address output in the previous refresh cycle. Similarly as in the previous refresh cycle, one row corresponding to this new refresh address Q0-Q6 is selected in the memory array 97 and the data in the memory cells connected to this newly selected roe is refreshed. The generation of refresh enable signal $\phi_R$ from the timer 93 is repeatedly carried out at a predetermined cycle as long as the external refresh signal $\overline{REF0}$ remains at "L" level and the signal $\overline{RAS0}$ at "H" level. Therefore, in each block of the memory array 97, 128 word lines are sequentially selected and the data in the memory cells connected to the respective selected word lines are refreshed. Taking a 64K bit DRAM as an example, all the memory cells in the memory array 97 are refreshed in 16 μs x 128=about 2 ms. In the battery backup mode with the main power supply OFF, the signal $\overline{REF0}$ is brought into a low level in response to the change of power supply, and the above refreshing is performed.

Usually, in the above-described DRAM, there is provided a substrate bias generator for reducing the parasitic capacitance between the DRAM circuit elements and the semiconductor substrate supporting the DRAM to assure a high-speed and a stable action of the DRAM. Thus, for the purpose of reducing the junction capacitance between the semiconductor substrate and the impurity region (source drain regions), stabilizing the threshold voltage of the MOS transistors formed on the semiconductor substrate, and inhibiting the generation of a parasitic MOS transistor comprising a signal line layer on the field insulation film and the impurity region on the surface of the semiconductor substrate, the semiconductor substrate is biased to a negative potential $V_{BB}$, in the case of p type substrate.

FIG. 2 shows an example of a conventional substrate bias generator for use in a DRAM with self-refresh function. Referring to FIG. 2, the substrate bias generator indicated generally at 41 comprises a ring oscillator 411 which outputs an oscillation signal $\phi_{CP}$ of predetermined frequency, a charge pump capacitor C which receives this oscillation signal from ring oscillator 411, an n-channel MOS transistor Q1 interposed between a node $N_B$ and the ground potential and adapted to clamp the potential of node $N_B$ at its threshold voltage level, and an n-channel MOS transistor Q2 interposed between the node $N_B$ and an output terminal 412 and adapted to clamp the node $N_B$ at a potential level which is determined by the difference between its threshold voltage and the potential of the semiconductor substrate.

FIG. 3 shows waveforms explaining the action of the substrate bias generator illustrated in FIG. 2. The operation of the substrate bias generator is briefly described below with reference to FIGS. 2 and 3.

When the oscillation signal $\phi_{CP}$ from the ring oscillator 411 is raised to "H" level, the potential of node $N_B$ tends to rise to "H" level, which is the supply potential level $V_{CC}$, due to capacitive coupling through the capacitor C. In response to this increase at node $N_B$ in potential, the MOS transistor Q1 becomes conductive and the potential at this node $N_B$ is clamped at the threshold voltage level $V_{VT1}$ of MOS transistor Q1, In this stage, the MOS transistor Q22 remains OFF.

Then, as the oscillation signal $\phi_{CP}$ falls to "L" level, the potential at node $N_B$ is also decreased by capacitive coupling of the capacitor C. In response to this decrease in potential at node $N_B$, the MOS transistor Q1 becomes OFF while the MOS transistor Q2 is turned ON, with the result that a positive charge flows from the semiconductor substrate to node $N_B$. When this potential at node $N_B$ reaches a value equal to the difference between the semiconductor substrate potential $V_{BB}$ and the threshold voltage $V_{T2}$ of MOS transistor Q2, the MOS transistor Q2 becomes non-conductive so that the movement of the charge is stopped. By this one cycle of the rise and fall of oscillation signal $\phi_{CP}$, the potential of the semiconductor substrate is decreased only a little. However, as the same cycle is repeated many times, the semiconductor substrate voltage $V_{BB}$ decreases by degrees until a certain negative potential is established. With the supply voltage being $V_{CC}$, the bias voltage $V_{BB}$ of this semiconductor substrate is $V_{T1}+V_{T2}-V_{CC}$ under ideal conditions and is generally a value of about $-3V$.

It will be apparent from the above description that in the conventional dynamic random access memory, the substrate bias generator is constantly functioning and consuming the same power, whether in the normal operating mode or in the self-refresh mode.

However, in the self-refresh mode, other actions than refreshing, such as data write/read and column selection are not performed. Therefore, the substrate leak current flowing into the semiconductor substrate (the hole current generated in circuit operation) is smaller in the self-refresh mode than in the normal operating mode and, moreover, the amount of leakage current in the self-refresh mode is predictable. Therefore, the power consumption is minimized during the self-refresh mode, or the battery backup operation. The conventional DRAM, however, has the drawback that the substrate bias generator consumes as much power during the self-refresh mode as in the normal operation or refresh mode.

Furthermore, Japanese Pat. Publication KOKAI No. 59688/1986 discloses the RAM construction including a pair of substrate bias generators having different biasing capacities, with the substrate bias generator with the larger biasing capacity being driven in the self-refresh mode. However, in this construction, too, the substrate bias generator with the larger biasing capacity is continuously driven during the refresh mode, thus entailing an unnecessary power consumption.

A still another DRAM with self-refresh function has been proposed by Taniguchi et al., "Fully Boosted 64K Dynamic RAM with Automatic and Self-Refresh", IEEE Journal of Solid-State Circuits, Vol. SC-16, No. 5, October 1981, pp. 492–498. This literature contains no discussion on the subject of power dissipation of the substrate bias generator.

SUMMARY OF THE INVENTION

It is an object of this invention to provide an improved dynamic random access memory with self-refresh function which can overcome the above-mentioned disadvantages of the prior art DRAM.

It is another object of this invention to provide a dynamic random access memory which provides a reduced power consumption in the self-refresh or battery backup mode.

It is still another object of this invention to provide a dynamic random access memory with self-refresh function which has an improved substrate bias generator capable of generating a necessary substrate bias voltage with low power consumption in the self-refresh mode.

It is a further object of this invention to provide a substrate bias generator for use in a dynamic random access memory, which is capable of generating a substrate bias voltage with a minimum of power consumption in exact response to the semiconductor substrate potential in the self-refresh mode.

The dynamic random access memory of this invention comprises circuitry for generating an internal refresh instruction signal in response to an external refresh instruction signal, circuitry which, in response to the internal refresh instruction signal, generates a refresh enable signal having a predetermined pulse width in a predetermined cycle, circuitry for applying a substrate biasing voltage to the semiconductor substrate, and circuitry which, in response to the internal refresh instruction signal and refresh enable signal, activates a substrate biasing circuit for a time period shorter than one cycle of the refresh enable signal.

Preferably, the substrate biasing circuit comprises a couple of substrate bias voltage applicators with different biasing capacities, a substrate potential detector and a circuit which, in response to the detected substrate potential, supplies an activation signal to one of said substrate bias applicators.

Preferably, the substrate potential detector has an input of high input impedance and detects the substrate potential through this input.

The method for applying the substrate bias voltage in the dynamic random access memory in accordance with this invention comprises a step of generating an internal refresh instruction signal in response to an external refresh instruction signal, a step of generating a refresh enable signal in a predetermined cycle in response to the internal refresh instruction signal, and a step of applying a substrate bias potential to the semiconductor substrate for a time period shorter than one cycle of said refresh enable signal in response to the internal refresh instruction signal and refresh enable signal.

The step of applying a bias voltage to the semiconductor substrate includes a step of applying the bias potential only for a period shorter than the pulse width of the refresh enable signal.

Preferably, the bias application step includes a step of detecting the potential of the semiconductor substrate and a step of activating the bias generator with the biasing capacity corresponding to the detected substrate potential.

Preferably, the substrate potential detection step includes a step of detecting the potential of the semiconductor substrate through the high input impedance.

In the dynamic random access memory of this invention, since the substrate biasing circuit is activated only for a certain part of the refresh action cycle time, the power consumption in the substrate biasing circuit can be as much decreased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 9A and 9B are signal waveform diagrams illustrating the action of the timer shown in FIG. 8;

FIGS. 14A and 14B are diagrams showing the timing relation of the word line activation signal with the action of the substrate bias generator in the self-refresh mode, wherein FIG. 14A shows the sequence of action of the conventional substrate bias generator while FIG. 14B shows the action timing of the substrate bias generator according this invention;

DESCRIPTION OF THE PREFERRED EMBODIMENTS

Figure 4:
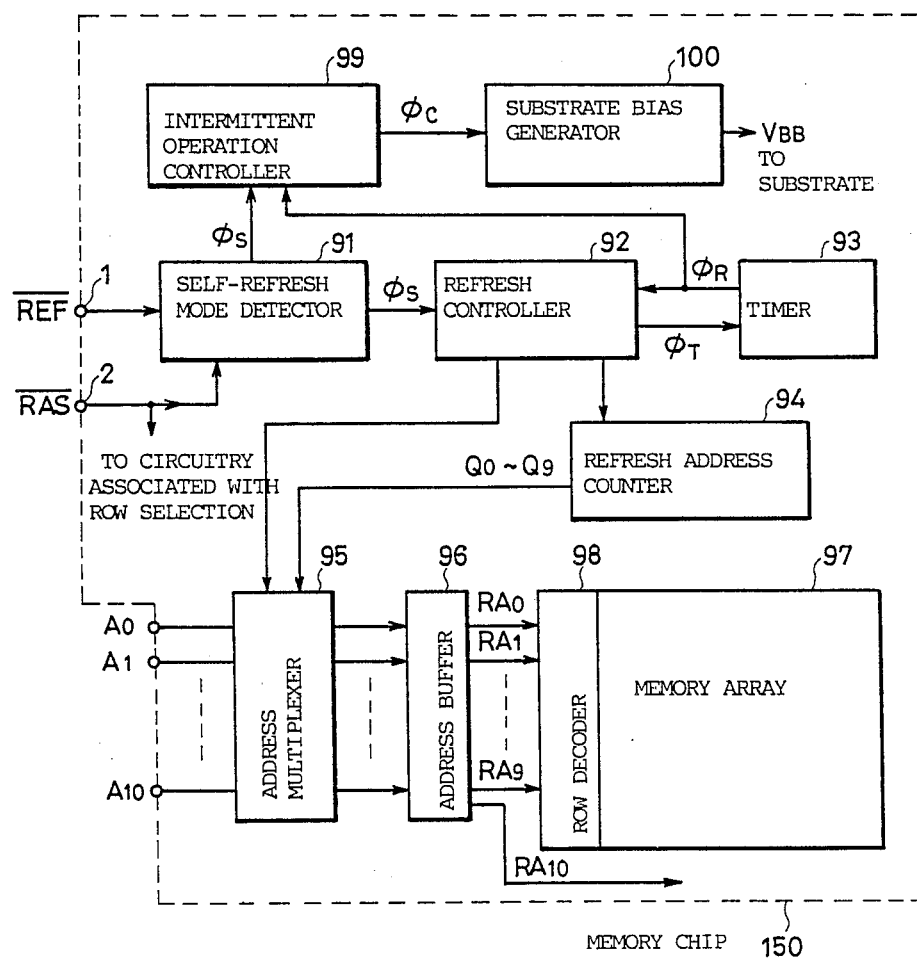
FIG. 4 is a schematic block diagram for the main part of a dynamic random access memory embodying the principle of this invention.

FIG. 4 is a schematic block diagram showing the construction of a dynamic random access memory as an embodiment of this invention. In FIG. 4, the refresh circuitry and substrate bias generation circuitry of a 4M ($2 \cdot 2^{20}$) bit DRAM are shown.

Referring to FIG. 4, this dynamic random access memory includes a memory array 97 consisting of 2048 ($2^{11}$) x 2048 ($2^{11}$) memory cells in a matrix arrangement. The memory array 97 is divided into two blocks. Each block comprises 1024 x 2048 memory cells. For selecting one row from the memory array 97, there are provided an address multiplexer 95 adapted to selectively pass either an external address signal A0-A10 or a refresh address signal Q0-Q9 from a refresh address counter 94, an address buffer 96 adapted to receive an address signal from the address multiplexer 95 and generate an internal row address signal RA0-RA10, and a row decoder 98 adapted to decode the 10-bit internal address signal RA0-RA9 from the address buffer 96 and select the corresponding one row from the memory array 97. By the address signal RA0-RA9, one word line from each block or simultaneously two word lines from the whole array are selected. The most significant row address signal RA10 from the address buffer 96 is used as an address signal for block selection.

For refreshing of the random access memory, this random access memory includes a self-refresh mode detector 91 which, in response to an external refresh signal $\overline{REF0}$ and a row address strobe signal $\overline{RAS0}$ given to its input terminals 1 and 2, respectively, senses whether a self-refresh has been designated and, when there is such designation, outputs an internal self-refresh instruction signal $\phi_S$, a refresh controller 92 which, in response to the internal self-refresh instruction signal $\phi_S$ from the self-refresh mode detector 91, drives a timer 93 and a refresh address counter 94, and a timer 93 which is driven in response to a timer start signal $\phi_T$ from the refresh controller 92 and outputs a refresh enable signal in a predetermined cycle. The timer 93 is driven by the refresh instruction signal (timer start signal) $\phi_T$ from the refresh controller 92 and applies a refresh enable signal $\phi_2$ to the refresh controller 92 and intermittent operation controller 99 every preset time T (16 μs maximum) while the signal $\phi_T$ remains in active state. The signal $\phi_T$ is rendered active when the signal $\phi_S$ has remained active for more than a predetermined time.

In response to the refresh enable signal $\phi_R$ from the timer 93 and under the control of the refresh controller 92, the refresh address counter 94 increments its count value. Furthermore, in response to the internal self-refresh instruction signal $\phi_S$ from the self-refresh mode detector 91, the refresh controller 92 causes the address multiplexer 95 to select the refresh address signal Q0-Q9 from the refresh address counter 94.

For applying a necessary bias voltage to the semiconductor substrate, the DRAM includes an intermittent operation controller 99 which, in response to the internal self-refresh instruction signal $\phi_S$ from the self-refresh mode detector 91 and the refresh enable signal $\phi_R$ from the timer 93, outputs an activation signal $\phi_C$ with a predetermined time width and a substrate bias generator 100 which is activated in response to a control signal $\phi_C$ from the intermittent operation controller 99 and applies a necessary bias voltage to the semiconductor substrate.

In the above construction, every time the refresh enable signal $\phi_R$ is generated, the refresh address counter 94 increments its count and outputs a refresh address signal Q0-Q9 according to the count value. This refresh address signal Q0-Q9 is fed to the row decoder 98 via the address multiplexer 95 and address buffer 96. The row decoder 98 decodes this 10-bit refresh address signal Q0-Q9 (20 bits for the internal address signal RA0-RA9 where it is given as complementary data) and select the corresponding one row from each block of the memory array 97. Then, the data in the memory cells connected to this selected word line is refreshed. Therefore, on the self-refresh mode, the data in all the memory cells within the memory array 97 are refreshed in a cycle of 16 μs x 1024=about 16 ms. On this self-refresh mode, while the signal $\overline{RAS0}$ governing the standby and operative states of the DRAM is at "H" level and the internal refresh signal $\overline{REF0}$ is at "L" level, the word lines in the memory array 97 are sequentially selected in response to refresh address signals Q0-Q9 to refresh the stored data.

Figure 5:
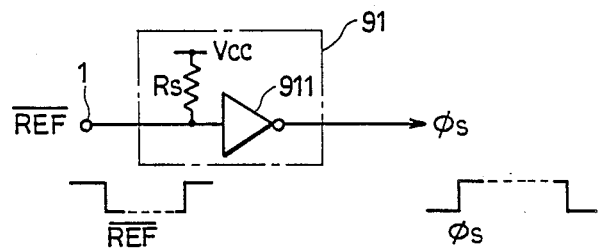
FIG. 5 is a diagrammatical view showing an example of the self-refresh mode detector illustrated in FIG. 4.

FIG. 5 shows a specific example of the self-refresh mode detector 91. Referring to FIG. 5, the detector 91 includes an inverter 911 which receives the external refresh signal $\overline{REF0}$ fed to the input terminal 1. Interposed between the input terminal 1 and the input of said inverter 911 is a high-resistance pull-up resistor $R_S$. In this construction, when the external refresh signal $\overline{REF0}$ is brought to "H" level, or the pin is in an "open" state, the input of the inverter 911 is raised to the supply voltage level $V_{CC}$ by the high-resistance pull-up resistor $R_S$, so that the output $\phi_S$ of the inverter 911 falls to the "L" level. When the external refresh signal $\overline{REF0}$ is at the "L" level, the inverter 911 outputs an "H" level output signal $\phi_S$. By this arrangement, an internal refresh instruction signal $\phi_S$ designating the self-refresh mode can be generated in response to the external refresh signal $\overline{REF}$ As the signal $\phi_S$ remains at "H" level for more than a predetermined time, the self-refresh mode is detected and the signal $\phi_S$ is raised.

Figure 6:
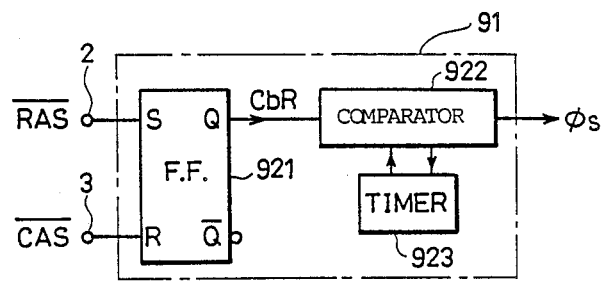
FIG. 6 is a diagrammatic view showing another example of the self-refresh, mode detector illustrated in FIG. 1.

FIG. 6 is a view showing the DRAM construction where instead of providing dedicated input terminal for the refresh instruction control signal, the self-refresh mode is designated using the external row address strobe signal $\overline{RAS0}$ and column address strobe signal $\overline{CAS0}$ which are used in the conventional DRAM. In the construction shown in FIG. 6, the self-refresh mode detector 91 includes a flip-flop 921 with a set input S which receives the signal $\overline{RAS0}$ via an input terminal 2 and a reset input R which receives the signal $\overline{CAS0}$ fed via an input terminal 3, a comparator 922 which receives a signal CbR from the output terminal Q of the flip-flop 921, and a timer 923 which is started in response to an activation signal from the comparator 922 and counts a preset time. The timer 923 is started through the comparator 922 in response to the shift of signal CbR to the active state. In response to the count information from the timer 923, the comparator 922 raises the internal refresh instruction signal $\phi_S$ when the signal CbR has remained in the "H" level activated level for more than the preset time.

Figure 7:
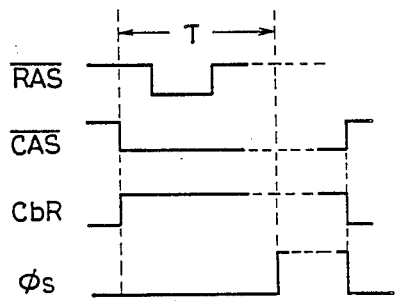
FIG. 7 is a signal waveform diagram showing the action of the self-refresh mode detector shown in FIG. 6.

The action of the self-refresh mode detector 91 illustrated in FIG. 6 is now described with reference to the waveform diagram given in FIG. 7.

In this construction, the designation of self-refresh is made by pulling down the signal $\overline{CAS0}$ to "L" while the signal $\overline{RAS0}$ is at "H" level. In this $\overline{CAS0}$ before $\overline{RAS0}$ refresh mode, the flip-flop 921 is set and its output signal CbR is raised to "H" level. In response to this shift of signal CbR to "H" level, the timer 923 is started through the comparator 922 and counts a preset time T'. The comparator 922 outputs "H" level signal $\phi_S$ when the signal CbR continuously remains at "H" level upon run-out of the timer 923 (elapse of the preset time). This "H" level of signal CbR persists while the signal $\overline{CAS0}$ remains at "L" level and the "H" level signal $\phi_S$ is generated during the time. When the level of signal $\overline{CAS0}$ becomes "H", the flip-flop 921 is reset and the level of its output signal CbR becomes "L", with the result that the signal $\phi_S$ from the comparator 922 also becomes "L". The refresh operation is completed in this manner.

Figure 8:
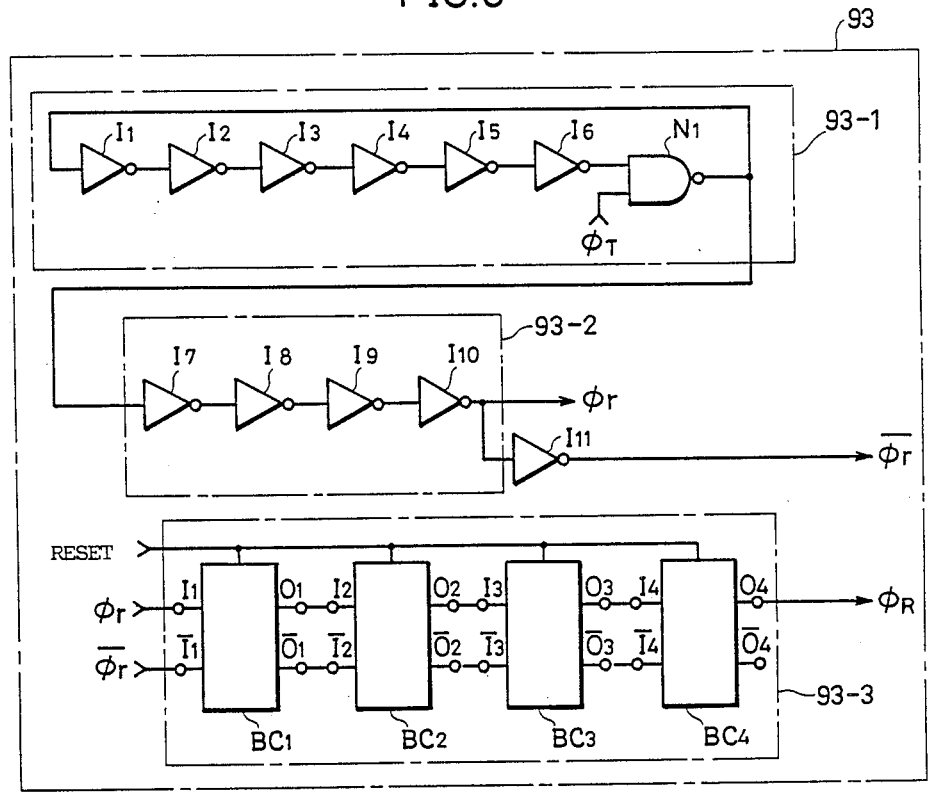
FIG. 8 is a diagrammatic view illustrating an example of the timer 93 shown in FIG. 4.

FIG. 8 is a diagrammatic representation of the construction of the timer shown in FIG. 4. Referring to FIG. 8, the timer 93 comprises a ring oscillator 93-1 which is activated and oscillates in response to a signal $\phi_T$ from the refresh controller 92, a buffer circuit 93-2 which performs a waveform shaping of the oscillator 93-1 and a counter circuit 93-3 which counts the pulse signal from the buffer 93-2 and outputs a refresh enable signal $\phi_R$ every predetermined count value.

The ring oscillator 93-1 comprises 6 serial stages of inverters I1 to I6 and a NAND gate N1 which receives the output from inverter I6 at one input thereof and a drive signal $\phi_T$ from the refresh controller 92 at the other input. The output from NAND gate N1 is fed to the buffer 93-2 and, at the same time, returned to the input of the first-stage inverter I1.

The buffer 93-2 includes 4 serial stages of inverters I7-I10. By this buffer 93-2, the dullness of the waveform of the oscillation signal output from the ring oscillator 93-1 is corrected. The inverter I10 outputs an oscillation signal $\phi_r$ and the inverter I11 inverts this output from the inverter I10 and outputs an inverse output signal $\overline{\phi_r}$. These complementary oscillation signals $\phi_r$ and $\overline{\phi_r}$ are fed to the counter circuit 93-3. The counter circuit 93-3 is provided with 4 stages of binary counters BC1-BC4 connected in series. Each of the binary counters BC1-BC4 divides the frequency of the signals supplied to inputs I, $\overline{I0}$ by 2 and outputs the result. The operation of each component is described below.

Figure 9A:
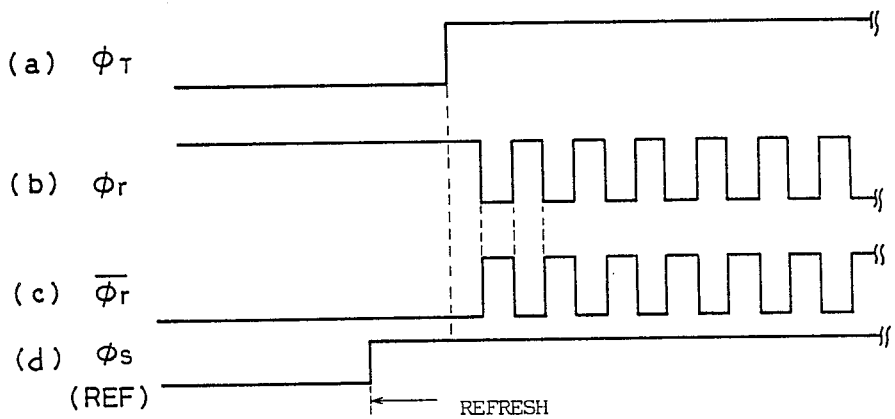

First, the action of the ring oscillator 93-1 is described below with reference to FIG. 9A which is waveform diagram of this oscillator. When the drive signals $\phi_T$ from the refresh controller 92 is at "L" level and the self-refresh mode has not been designated, the output of the NAND gate N1 is at a constant "H" level and the ring oscillator 93-1 does not oscillate.

Then, when the signal $\phi_S$ remains at "H" level for more than a preset time T11, the self-refresh mode is detected and the drive signal $\phi_T$ rises up to "H" level, the NAND gate N1 acts as an inverter. Therefore, the inverters I1 to I6 and NAND gate N1 become equivalent to the 7-stage inverters so that the ring oscillator 93-1 begins to oscillate. This oscillation signal from the ring oscillator 93-1 is fed to the buffer circuit 93-2 in which its waveform is shaped. The thus-shaped complementary oscillation signals $\phi_r$, $\overline{\phi_r}$ are fed to the counter circuit 93-3.

The binary counters BC1-BC3 in the counter circuit 93-3 perform the counting actions illustrated in FIG. 9B. Thus, the binary counter BC1 outputs an output signal 01 raised to "H" level every two oscillation signals $\phi_r$. Therefore, as the output of the binary counter BC1, a signal with a duty ratio of 50 and a cycle of 2 $\mu$s is generated when the cycle of signal $\phi_r$ is 1 $\mu$s. Similarly, the binary counter BC2 gives an output signal 02 with a duty ratio of 50 and a cycle of 4 $\mu$s, and the binary counter BC3 gives an output signal 03 with a cycle of 8 $\mu$s and a duty ratio of 50. As a result, the binary counter BC4 outputs a refresh enable signal $\phi_R$ with a duty of 50% and a cycle of 16 $\mu$s. When this refresh enable signal $\phi_R$ attains the "H" level, a refresh operation is automatically performed.

If necessary, a reset signal RESET can be used in each of the binary counters BC1-BC4 and, its count output can be reset to a desired value.

Figure 10:
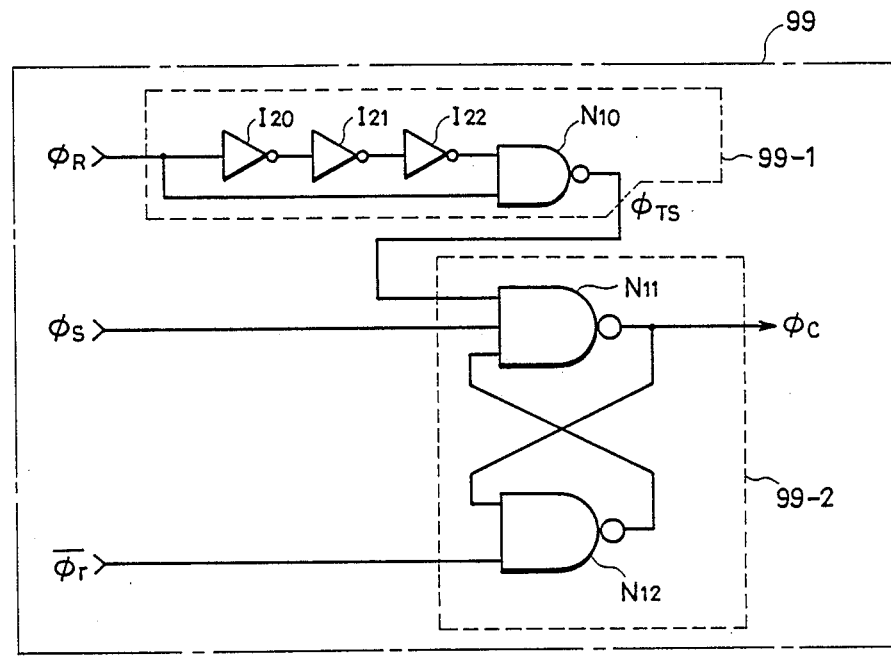
FIG. 10 is a view showing an example of the intermittent operation controller 99.

FIG. 10 is a diagrammatic representation of an example of the intermittent operation controller shown in FIG. 4. Referring to FIG. 7, the intermittent operation controller 99 comprises a one-shot pulse generator 99-1 which, in response to the refresh enable signal $\phi_R$ from the timer 93, outputs one shot of pulse signal $\phi_{TS}$ and a flip-flop 99-2 which, in response to the one-shot pulse signal $\phi_{TS}$ from the one-shot pulse generator 99-1, the self-refresh instruction signal $\phi_S$ from the refresh mode detector 91 and the inverted oscillation signal $\overline{\phi_r}$ from the timer 93, outputs a signal $\phi_C$ for controlling the action of the substrate bias generator 100.

The one-shot pulse generator 99-1 includes a series of 3 stages of inverters I20-I22 which receives the refresh enable signal $\phi_R$ and a NAND gate N10 which receives the output of inverter I22 at one input thereof and the refresh enable signal $\phi_R$ at the other input. The inverters I20-I22 inverse and delay the refresh enable signal $\phi_R$ and feed it to one of the inputs of NAND gate N10.

The $\overline{SR0}$ flip-flop 99-2 includes a 3-input NAND gate N11 which receives the one-shot pulse signal $\phi_{TS}$, self-refresh mode detection signal $\phi_S$ and the output of a NAND gate N12 to be described later and a 2-input NAND gate N12 which receives the output of the NAND gate N11 at one input thereof and an inverse oscillation signal $\overline{\phi_r}$ from the ring oscillator 93-1 and buffer 93-2 in the timer circuit 93 at the other input. The NAND gate N11 outputs a signal $\phi_C$ from controlling the action of the substrate bias generator 100. The action of the intermittent operation controller 99 is explained below.

Figure 11A:
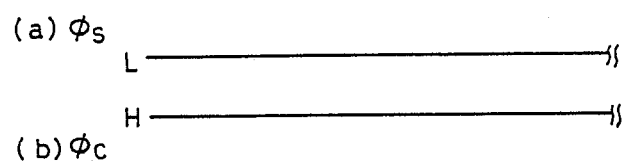
FIGS. 11A and 11B are signal waveform diagrams illustrating the action of the intermittent operation controller shown in FIG. 10.

The action which is in a state other than the self-refresh mode and the self-refresh mode detection signals $\phi_S$ is at "L" level is described below with reference to FIG. 11A. In this condition, the output of NAND gate N11 is constantly at "H" level, irrespective of the output of NAND gate N12 and the signal $\phi_{TS}$. When this signal $\phi_C$ is thus at "H" level, the substrate bias generator 100 is activated to supply the bias potential to the semiconductor substrate.

Figure 11B:
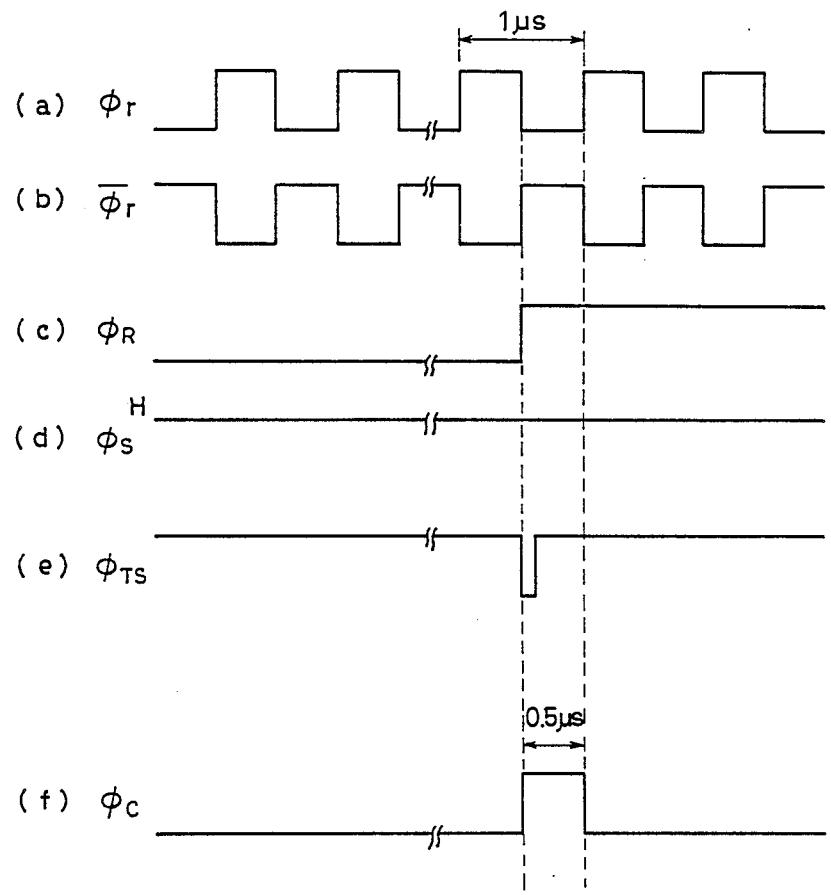

Suppose, now, that the level of signal $\overline{REF0}$ becomes "L" and the DRAM has entered into the self-refresh mode after lapse of a predetermined time. In this condition, in response to the shift of signal $\overline{REF0}$ to "L" level, the self-refresh mode detection signal $\phi_S$ is raised to "H" level as shown in FIG. 11B. Prior to lapse of the predetermined time and the self-refresh enable signal $\phi_R$ still remains at "L" level, the output signal $\phi_{TS}$ of one-shot pulse generator 99-1 is at "H" level. Then, as the predetermined time elapses and the refresh enable signal $\phi_R$ has risen up to "H", the signal $\phi_{TS}$ is pulled down to "L" level for a given time width (which is determined by the delay time in inverters I10–I12) in response to the rise-up of signal $\phi_R$. As a result, the output of NAND gate N11 rises to "H" level. This rise up of output signal $\phi_C$ from the NAND gate N11 is synchronized with the rise-up of inverted signal $\overline{\phi_r}$, and while this inverse signal remains at "H" level, the signal $\phi_C$ is maintained at "H" level. Then, as the inverse signal $\overline{\phi_r}$ is shifted down to "L" level, the inputs of the 3-input NAND gate N11 are all raised to "H" level and its output signal $\phi_C$ is reset to "L" level. The time width during which the above signal $\phi_C$ is active is about 0.5 μs when the cycle time of the oscillation signal $\phi_r$ from the timer 93 is 1 μs.

Figure 12:
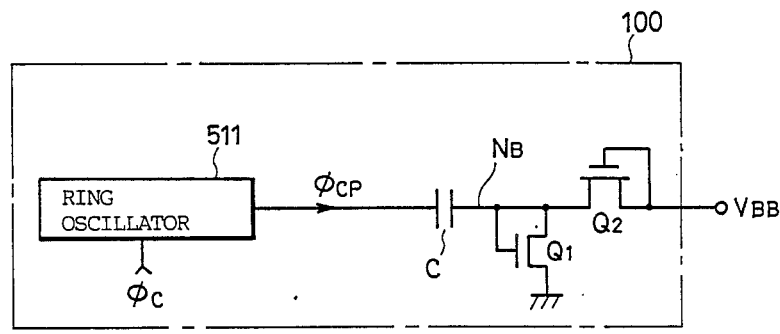
FIG. 12 is a diagrammatic view showing an example of the substrate bias generator illustrate in FIG. 4.
Figure 13:
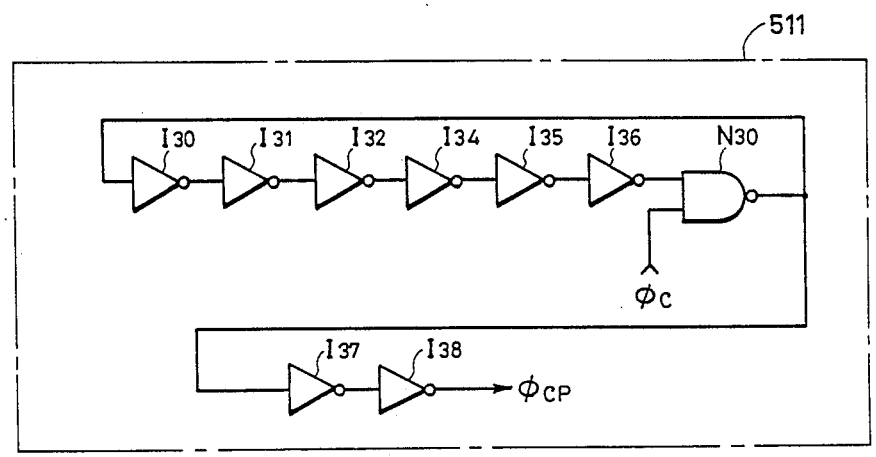
FIG. 13 is a diagrammatic view showing an example of the ring oscillator illustrated in FIG. 12.

FIG. 12 is diagrammatic view showing a specific example of the substrate bias generator 100 illustrated in FIG. 4. In the construction of FIG. 12, the substrate bias generator 100 includes a charge pump capacitor C, voltage-clamp MOS transistors Q1, Q2 and a ring oscillator 511 which outputs an oscillation signal $\phi_{CP}$ of predetermined frequency. The operation of the ring oscillator 511 is controlled by the control signal $\phi_C$ from the intermittent operation controller 99. FIG. 13 shows a specific example of the ring oscillator 511 illustrated in FIG. 12.

Referring to FIG. 13, the ring oscillator 511 comprises 7 serial stages of inverters I30–I36, a NAND gate N30 which receives the output of inverter I36 at one input thereof and the control signal $\phi_C$ at the other input, and a series of 2 stages of inverters I37, I38 which receives the output of a NAND gate N30. The NAND gate N30 acts as an inverter when the control signal $\phi_C$ at "H" level and outputs an "H" level signal when the control signal $\phi_C$ is at "L" level irrespective of the output state of inverter I36. Therefore, when the control signal $\phi_C$ is at "H" level, the inverters I30–I36 and NAND gate N30 constitute a 7-stage ring oscillator. The NAND gate N30 outputs an oscillation signal $\phi_{CP}$ dictating the charge pumping action of the charge pump capacitor C through the waveform-shaping inverters I37, I38.

Figure 1:
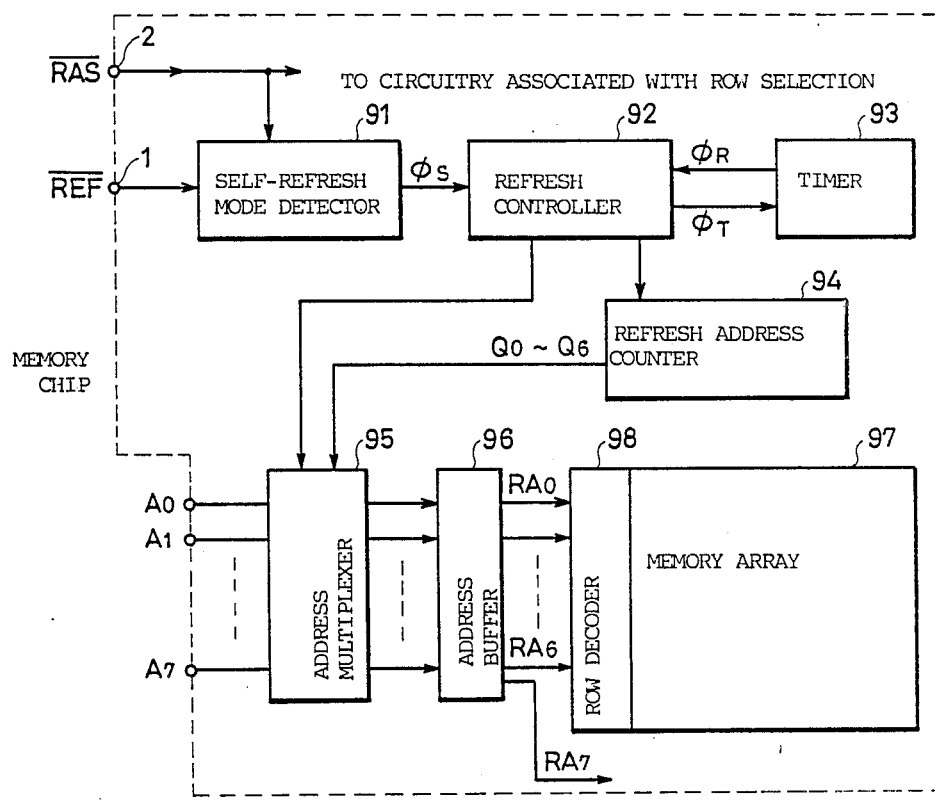
FIG. 1 is a schematic view illustrating the construction of the main part of the conventional dynamic random access memory.
Figure 2:
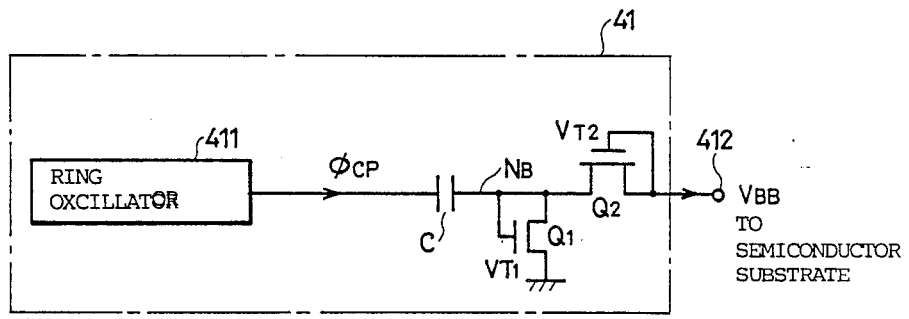
FIG. 2 ss a diagram showing an example of the substrate bias generator to be used in the dynamic random access memory of FIG. 1.
Figure 3:
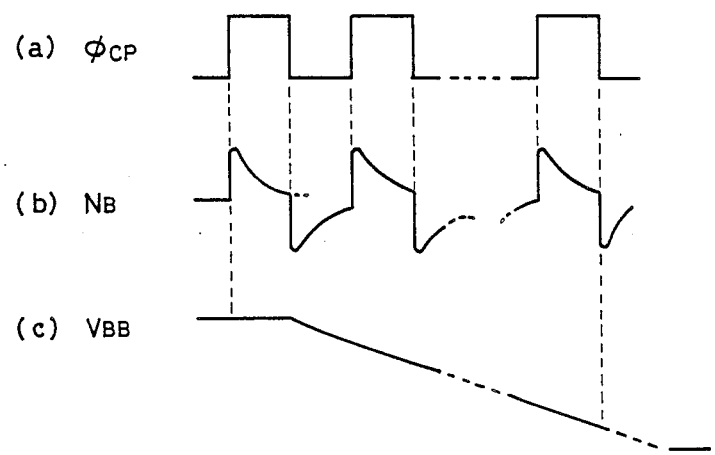
FIG. 3 is a signal waveform diagram illustrating the action of the substrate bias generator shown in FIG. 2.

When the ring oscillator construction shown in FIG. 13 is compared with the conventional construction illustrated in FIG. 2, the following difference is apparent. In the conventional ring oscillator illustrated in FIG. 2, the oscillator oscillates constantly irrespective of the operation state of the DRAM. However, the ring oscillator 511, shown in FIG. 10, according to this invention oscillates only when the control signal $\phi_C$ is at "H" level and does not oscillate while the control signal $\phi_C$ is at "L" level, so that its signal output is maintained at "H" level. As shown in FIG. 11B, this control signal $\phi_C$ is raised to and held at the activated "H" level only for a predetermined time in response to the refresh enable signal $\phi_R$ output from the timer 93.

On the other hand, as described above, the refresh address counter 94 is activated through the refresh controller 92 in response to the refresh enable signal $\phi_R$ and the word line in the address corresponding to its refresh address signal Q0–Q9 is selected from the memory array 97 so that the data in the memory cell connected to the selected word line is refreshed.

Figure 14A:
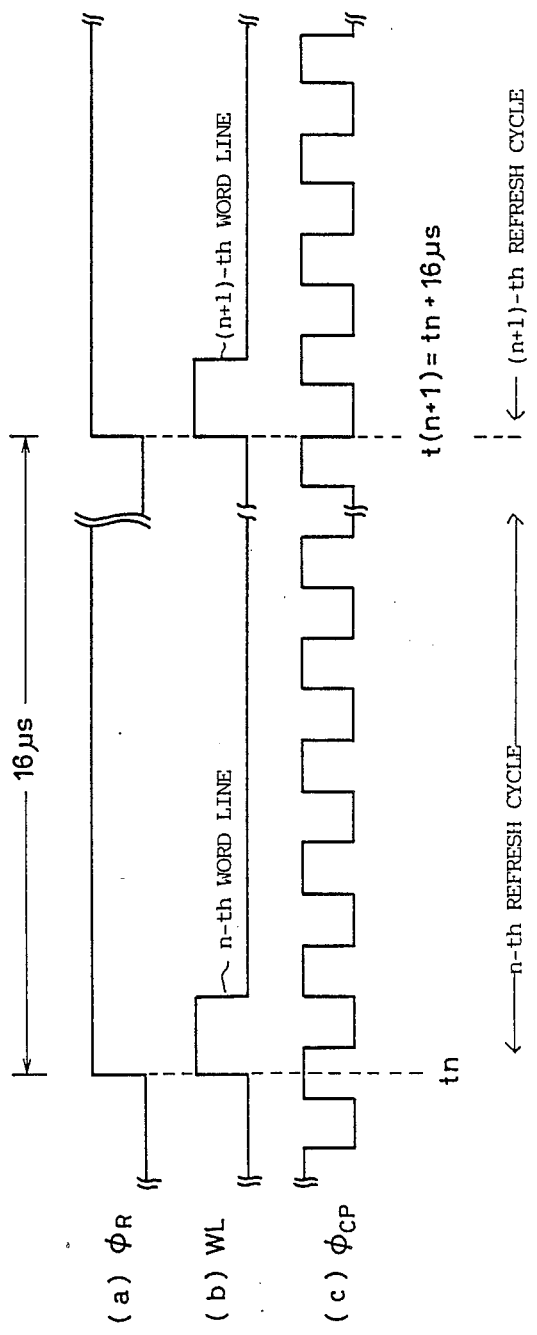
Figure 14B:
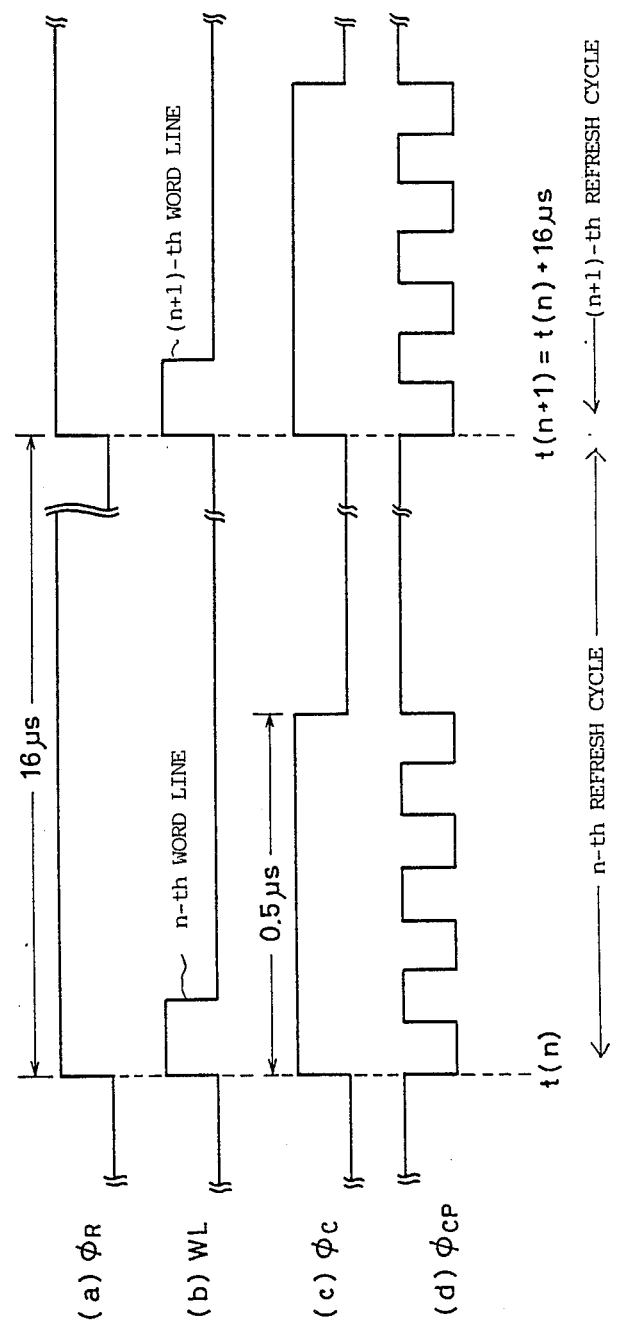

The operation timing waveform diagrams given in FIG. 14A and 14B are related to the prior art and this invention, respectively. These diagrams show the difference between the prior art and this invention in regard to the temporal relationships, namely the timing of activation of the refresh enable signal $\phi_R$, the timing of selection of a word line, and the timing of output of an oscillation signal from the ring oscillator. FIG. 14A shows the relationship of the refresh enable signal, selection of a word line, and charge pump oscillation signal $\phi_{CP}$ in the conventional DRAM, while FIG. 14B shows a similar relationship in an embodiment of this invention.

As shown in FIG. 14A, as the refresh enable signal $\phi_R$ rises up to "H" level every 16 μs, the word lines are sequentially selected in response to the refresh address signal from the refresh address counter 94 and the potential WL of the selected word line is increased to "H". As shown in FIG. 14A, for instance, the (n)-th word line is activated at time t (n) and the (n+1)-th word line is activated at time t(n) and the (n+1)-th word line is activated at time t (n+1) which is 16 μs after time t (n). In the conventional substrate bias generator circuit construction, the output signal $\phi_{CP}$ of its ring oscillator 411 oscillates continuously without regard to the selection of word lines or the timing of refresh enable signal $\phi_R$.

This is in contrast with the substrate bias generator in an embodiment of this invention where, as shown FIG. 14B, the oscillation signal $\phi_{CP}$ from its ring oscillator 511 oscillates only during a period of about 0.5 μs from the rise-up of refresh enable signal $\phi_R$ and the substrate bias voltage is generated only during this period. In this arrangement, as will be apparent from FIG. 11B, it is possible to actuate the substrate bias generator only before and after the period during which word line selection and refreshing are carried out (this is usually about 100 to 200 ns).

Generally speaking, the substrate bias voltage decreases in absolute value due to a leak current (hole current) which may take place, for instance, between the source region of a MOS transistor and a semiconductor substrate. The leak current into the semiconductor substrate is necessarily constant but is influenced by circuit operations. This substrate leak current is comparatively small when the switching state of transistors is fixed or quiescent but increases when a memory device circuit is operating and the switching states of MOS transistors are changed. Therefore, it is chiefly when the word lines are activated and the memory device is being refreshed that the substrate bias voltage undergoes change. Therefore, by driving the substrate bias generator only during this period it is possible to preclude such change in substrate bias voltage and reduce the power consumption in the substrate bias generator circuit.

In the foregoing embodiment, the substrate bias generator 100 is rendered active only during the minimum possible time, that is to say the period during which memory refreshing is actually performed. However, for the sole purpose of reducing the power consumption in the self-refresh mode, it is sufficient to drive the substrate bias generator intermittently during the self-refresh mode. The following description pertains to the construction in which the substrate bias generator is actuated during a period of time shorter than one refresh cycle and longer than the activation period of refresh enable signal (the period during which actual refreshing. is carried out).

Figure 15:
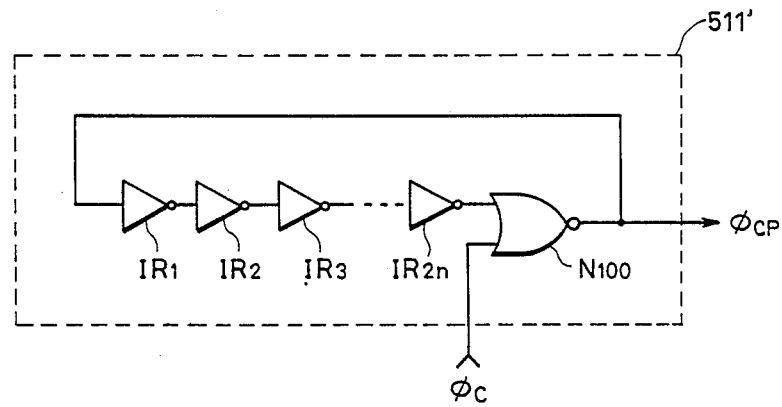
FIG. 15 is a diagrammatic view showing another example of the ring oscillator used in the substrate bias generator.
Figure 17:
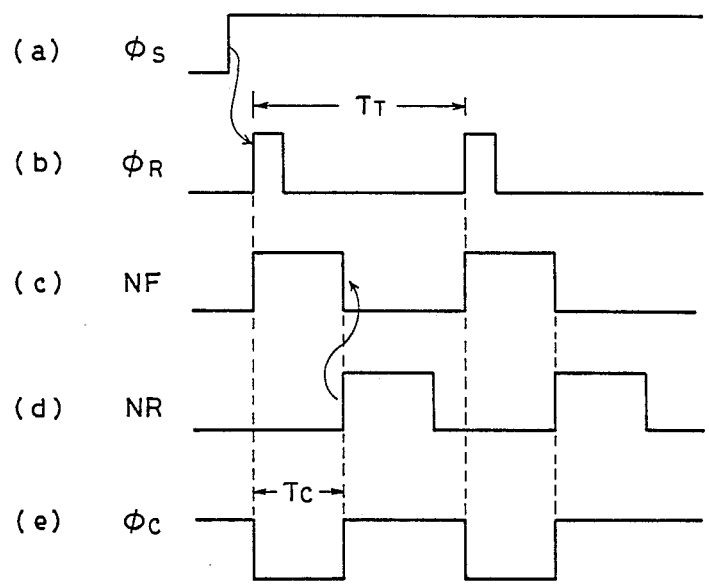
FIG. 17 is a signal waveform diagram showing the action of the controller illustrated in FIG. 16.

FIG. 17 shows a specific example of the ring oscillator in the substrate bias generator 100. Unlike the structure shown in FIG. 13, a NOR gate N100 is provided at the output stage. Thus, the ring oscillator, generally shown at 511', comprises an even number of inverters connected in series, $IR_1$-$IR_{2n}$, and a two-input NOR gate N100 which receives the output of inverter $IR_{2n}$ and the control signal $\phi_C$. The NOR gate N100 outputs an oscillation signal $\phi_{CP}$. The output of the NOR gate N100 is fed back to inverter $IR_1$. The NOR gate N100 acts as inverter when the control signal $\phi_C$ is at "L" level, and outputs an "L" level signal when the control signal $\phi_C$ is at "H" level, without regard to the output of inverter $IR_{2n}$. Therefore, the ring oscillator when the control signal $\phi_C$ is at "L" level. Thus, the substrate bias generator 100, when provided with the ring oscillator of FIG. 15, supplies the semiconductor substrate with the substrate bias voltage only when the control signal $\phi_C$ is at "H" level.

Figure 16:
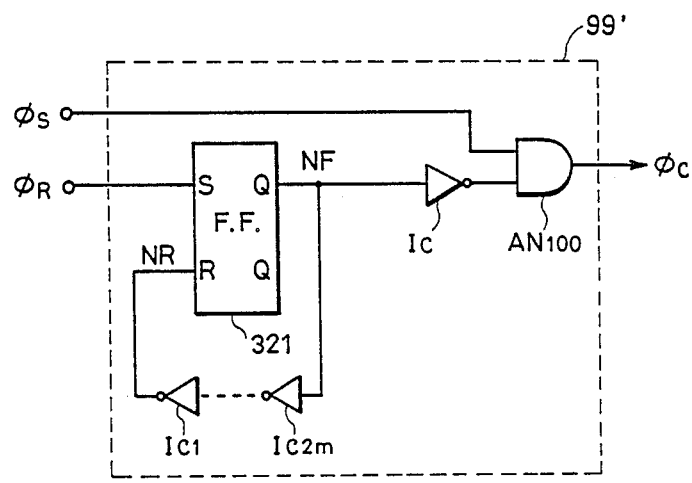
FIG. 16 is a view showing the construction of an intermittent operation controller as another embodiment of the invention.

FIG. 16 shows a specific example of the intermittent controller circuit.

Referring to FIG. 16, this intermittent operation control circuit, shown generally at 99,, includes an RS flip-flop 321, an inverter $I_C$ which receives the Q output of the RS flip-flop 312m and an AND gate AN100 which receives a self-refresh instruction signal $\phi_S$ and the output of the inverter $I_C$. The AND gate outputs a control signal $\phi_C$.

The RS flip-flop 312 has a set input S which receives the refresh enable signal $\phi_R$ and a reset input R which receives the Q output through an even number of inverters connected in series, $I_{c1}$-$I_{c2m}$. The inverters $I_{c1}$-$I_{c2m}$ constitute a delay circuit.

Figure 18:
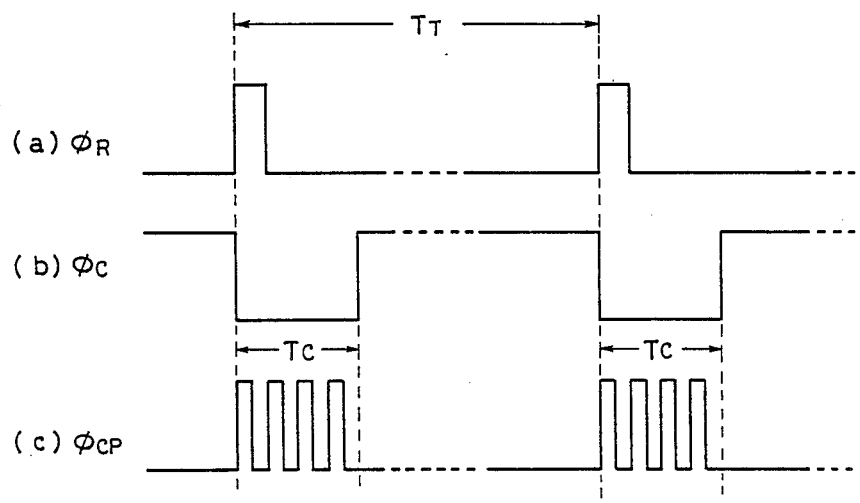
FIG. 18 is a view showing the action of the ring oscillator of the substrate bias generator in another embodiment of this invention.

FIG. 17 shows the operation waveform of the control circuit depicted in FIG. 16. FIG. 18 shows the action waveform of the substrate bias generator 511', in this embodiment. The action of the substrate bias generator in another embodiment of this invention will be described below with reference to FIGS. 15 through 18.

As the self-refresh signal $\phi_S$ is raised to "H" level to instruct the self-refresh mode, a timer 93 outputs a pulse signal (refresh enable signal) $\phi_R$ with a cycle time of $T_T$. As this refresh enable signal $\phi_R$ rises up to "H" level, the flip-flop 321 becomes set and its Q output (node $N_F$) level becomes "H". The node $N_F$ potential is fed to one of the inputs of an AND gate AN100 through the inverter $I_C$, whereby the AND gate AN100 is disabled and its output signal $\phi_C$ becomes "L". After the rise-up of node $N_F$ to "H" level and the delay time $T_C$ attributable to inverters $I_{c1}$-$I_{c2m}$, the node $N_R$ potential rises to "H", the flip-flop 321 is reset, and the node $N_F$ potential falls back to "L". As a result, the output of inverter $I_{c1}$ becomes "H". Since the refresh instruction signal $\phi_S$ is at "H" level, the control signal $\phi_C$ from AND gate AN100 becomes "H". Thus, as control signal $\phi_C$, a pulse signal with cycle time $T_T$ and pulse width $T_C$ can be obtained. As a result, the ring oscillator 511, oscillates, according to control signal $\phi_C$, only during time $T_C$ and refrains from oscillating during the subsequent period ($T_T$-$T_C$) The ring oscillator 511, repeats this intermittent action on the self-refresh mode. Since no power dissipation occurs in the substrate bias generator 511, during this suspension of oscillation, the overall consumption power of the DRAM is decreased.

On the other hand, during the normal operating and refresh mode other than the self-refresh mode, the signal $\phi_S$ remains at the low level. Therefore, irrespective of the level of signal $\phi_R$, the output signal $\phi_C$ is consistently at low level, so that the ring oscillator 511' keeps oscillating.

Though in the above embodiment, the oscillation of the ring oscillator was made intermittent by means of the output signal $\phi_R$ of the self-refresh timer circuit, the action of the ring oscillator may be controlled by the output signal of an independent timer circuit.

Figure 19:
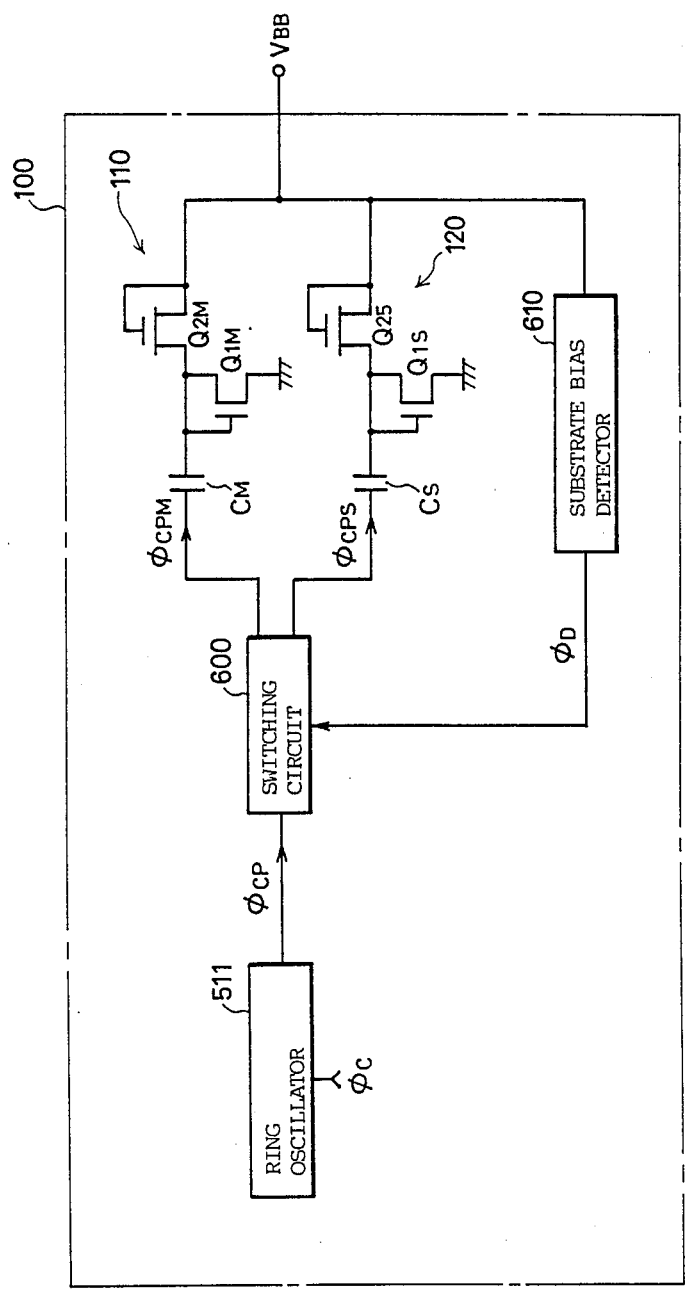
FIG. 19 is a view showing another version of the substrate bias generator illustrated in FIG. 4.

FIG. 19 is a block diagram showing a substrate bias generating circuit according to another embodiment of the present invention. The bias generating circuit shown in FIG. 19 includes a main bias generating circuit 110 having relatively large biasing capability (current supply capability), and a sub bias generating circuit 120 having relatively small biasing capability. In the configuration of FIG. 19, an oscillating signal $\phi_{CP}$ is transferred to either one of the bias generating circuits 110 and 120, in response to a substrate potential detecting signal $\phi_D$ from a substrate potential detecting circuit 610, under control of a switching circuit 600. The main biasing circuit 110 includes a charge pumping capacitor $C_M$ for receiving an oscillating signal $\phi_{CPM}$ from the switching circuit 600, and clamping MOS (metal-oxide-semiconductor) transistors $Q_{1M}$ and $Q_{2M}$.

The sub biasing circuit 120 includes a charge pumping capacitor $C_S$ for receiving an oscillating signal $\phi_{CPS}$ from the switching circuit 600, and clamping MOS transistors $Q_{1S}$ and $Q_{2S}$.

In general, biasing capability of a biasing potential generator employing charge pumping operation of a capacitor is determined by amount of injected charges per one pumping cycle and the number of operation of charge pumping per unit time, that is, by the capacitance value of a charge pumping capacitor, the oscillating frequency of a ring oscillator and drivability (current supply ability) of clamping MOS transistors. Thus, the main biasing circuit 110 is made greater in biasing capability than the sub biasing circuit 120 by making the capacitor $Q_{1M}$ larger in capacitance value than the capacitor $Q_{1S}$ and by making MOS transistor 2M greater in drivability (, or transistor size) than MOS transistor $Q_{2S}$. Then, operation of the circuitry shown in FIG. 19 will be described briefly in the following. Now, a case is considered in which the ring oscillator 511 is in oscillating state. The substrate bias detecting circuit 610 detects the potential level of the substrate bias voltage $V_{BB}$. If the detected level is smaller in the absolute value than a predetermined potential level, the switching circuit 600 is responsively so controlled to activate the main biasing circuit 110 so that the substrate bias voltage $V_{BB}$ is rapidly decreased to the predetermined level. After the bias voltage $V_{BB}$ reaches the predetermined potential, the sub biasing circuit 120 is activated under control of the switching circuit 600 in response to the detection signal $\phi_D$ from the substrate bias potential detecting circuit 610. As described above, where biasing ability of the substrate bias generator is adjusted according to the potential level of the substrate biased voltage $V_{BB}$ in oscillating operation of the ring oscillator 511, power dissipation therein can be more reduced than in the structure using a substrate bias generating circuit having only one kind of biasing ability as shown in FIG. 12.

Figure 20:
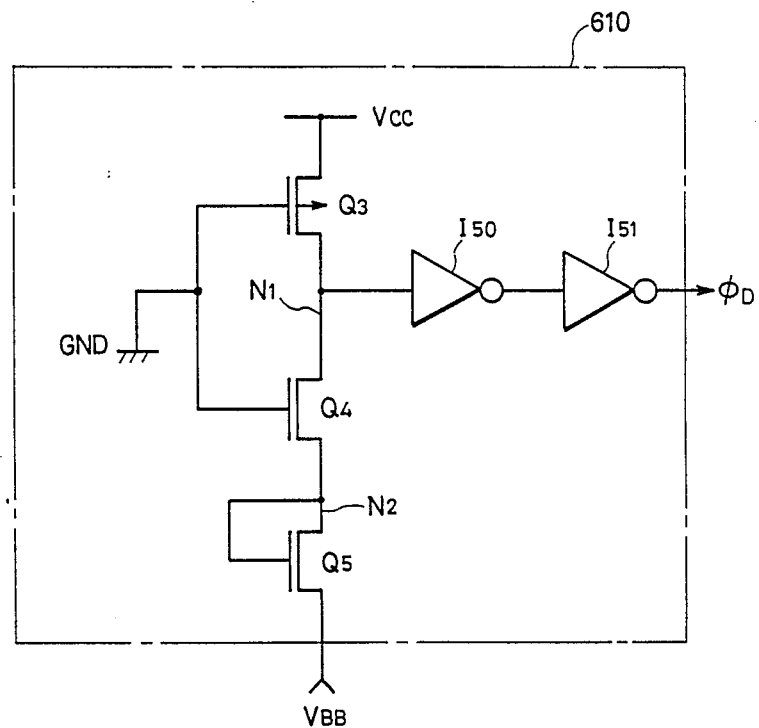
FIG. 20 is a view showing an example of the substrate bias potential detector illustrated in FIG. 19.

FIG. 20 shows a specific construction of the substrate potential detecting circuit shown in FIG. 19.

Referring to FIG. 20, the substrate potential detecting circuit 610 includes p channel MOS transistor Q3 and n channel MOS transistors Q4 and Q5 coupled in series between power supply potential Vcc and the substrate bias voltage $V_{BB}$. MOS transistor Q3 has one conduction terminal connected to the power supply potential Vcc, the gate connected to the ground GND and the other conduction terminal connected to a node N1. MOS transistor Q4 has the gate connected to the ground, one conduction terminal connected to the node N1 and the other conduction terminal connected to a node N2. MOS transistor Q5 has the gate and one conduction terminal both connected to the node N2, and the other conduction terminal connected to the substrate bias potential $V_{BB}$. The output potential level at the node N1 is supplied as the substrate potential detecting signal $\phi_D$ to the switching circuit 600 through waveshaping two-stage of inverters I50 and I51. Then, description is made on operation of the circuit.

MOS transistor Q3 has the gate connected to the ground GND, and therefore is normally turned off. Now, a case is considered in which the substrate biased voltage $V_{BB}$ is small in absolute value and the substrate bias is shallow. If the substrate bias voltage $V_{BB}$ is 0V, the potential level at the node N2 is made substantially equal to the threshold voltage of the transistor Q5. N channel MOS transistor Q4 has the gate connected to the ground GND, and the potential at the node N2 is greater than 0V, so that MOS transistor Q4 is in off-state. Thus, the node N2 is charged to a high level through MOS transistor Q3. In the state, the substrate potential detecting signal $\phi_D$ is made at a high ("H") level.

Then, it is assumed that the substrate bias voltage $V_{BB}$ becomes greater in absolute value than the value of $-(V_{T5}+V_{T4})$, where $V_{T4}$ and $V_{T5}$ indicate the threshold voltages of MOS transistors Q4 and Q5, respectively. In this case, the potential level at the node N2 becomes greater in absolute value than the value $-V_{T4}$. As a result, MOS transistor Q4 turns on so that MOS transistors Q4 and Q5 both are made conductive. In the instance, when the ratio of the conductances of MOS transistors Q3 and Q4 is appropriately selected, potential level at the node N1 can be made at low ("L") for the inverter I50. Thus, when the substrate bias is deep, the detecting signal $\phi_D$ is at "L" level. When the substrate bias voltage $V_{BB}$ becomes smaller in absolute value than the value of $-(V_{T5}+V_{T4})$ due to leak current into the substrate (hole current generated by circuit operation), MOS transistor Q4 is turned off. Consequently, the potential at the node N1 rises to "H" level so that the control signal $\phi_D$ becomes "H" level.

It should be noted that when MOS transistors Q4 and Q5 both are turned on, current flows from the power supply Vcc into the substrate to change the substrate potential, which makes the substrate bias voltage smaller in absolute value. In order to reduce deviation in the substrate bias voltage due to current flow through the potential detecting circuit itself and to sufficiently lower the "L" level at the node N1, the conductance of MOS transistor Q3 is set as small as possible. In other words, MOS transistor Q3 is made to have resistance as high as possible.

Figure 21:
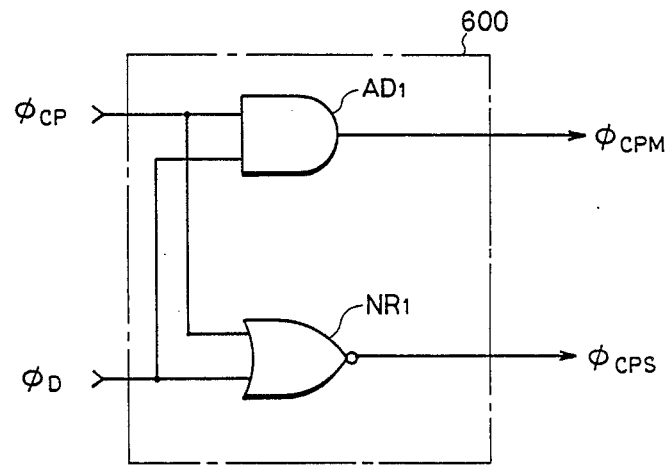
FIG. 21 is a view showing an example of the switching circuit illustrated in FIG. 19.

FIG. 21 is a diagram showing an example of a specific construction of the switching circuit 600 shown in FIG. 19. Referring to FIG. 21, the switching circuit 600 comprises an AND gate AD1 for receiving an oscillation signal $\phi_{CP}$ from the ring oscillator 511 and a detection signal $\phi_D$ from the substrate potential detecting circuit 610, and a NOR gate NR1 for receiving the oscillation signal $\phi_{CP}$ and the detection signal $\phi_D$. An output of the AND gate AD1 is supplied as an oscillation signal $\phi_{CPM}$ to the bias potential generating circuit 110 having the larger bias capability. An output of the NOR gate NR1 is supplied as an oscillation signal $\phi_{CPS}$ to the second bias potential generating circuit 120 having the smaller bias capability.

Figure 22:
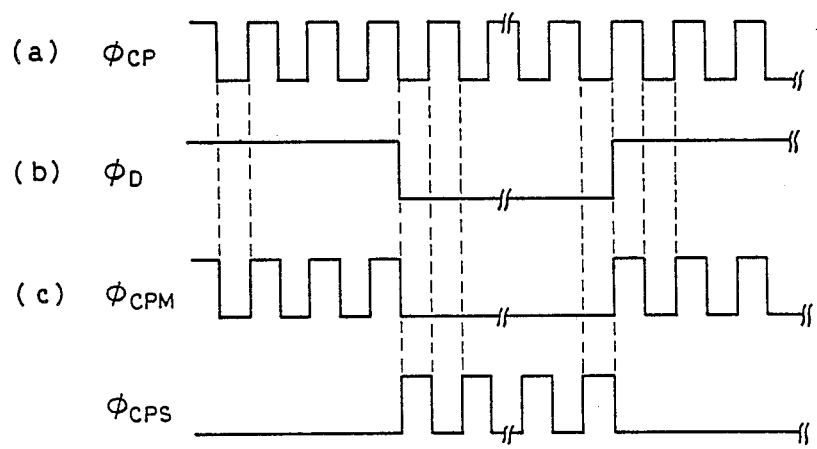
FIG. 22 is a signal waveform diagram showing the action of the switching circuit illustrated in FIG. 21.

FIG. 22 is a signal waveform diagram showing operation of the switching circuit 600 shown in FIG. 21. In the following, referring to FIGS. 19 to 21, operation of the switching circuit 600 will be described. If the detection signal $\phi_D$ of the substrate potential detecting circuit 610 is at H level, that is, if the potential of the semiconductor substrate does not attain the predetermined level, the AND gate AD1 permits the oscillation signal $\phi_{CP}$ to pass therethrough. On the other hand, the output of the NOR gate NR1 is maintained at L level independent of the level of the oscillation signal $\phi_{CP}$. Accordingly, if the detection signal $\phi_D$ is at H level, the oscillation signal $\phi_{CPM}$ is supplied to the capacitor $C_M$ of the first substrate bias potential generating circuit 110 having the larger bias capability, whereby the potential of the semiconductor substrate is rapidly lowered to the predetermined level.

On the other hand, when the potential of the semiconductor substrate attains the predetermined level and the detection signal $\phi_D$ from the substrate potential detecting circuit 610 falls to L level, the output of the AND gate AD1 falls to L level, while the NOR gate N1 operates as an inverter. Accordingly, the oscillation signal $\phi_{CPM}$ is fixed to L level and the oscillation signal $\phi_{CPS}$ is an oscillation signal obtained by inversion of the oscillation signal $\phi_{CP}$ from the ring oscillator 511. As a result, the second substrate bias potential generating circuit 120 having the smaller bias capability operates and the potential of the semiconductor substrate is maintained at the predetermined level by the charge pump function of the capacitance Cs.

Figure 23:
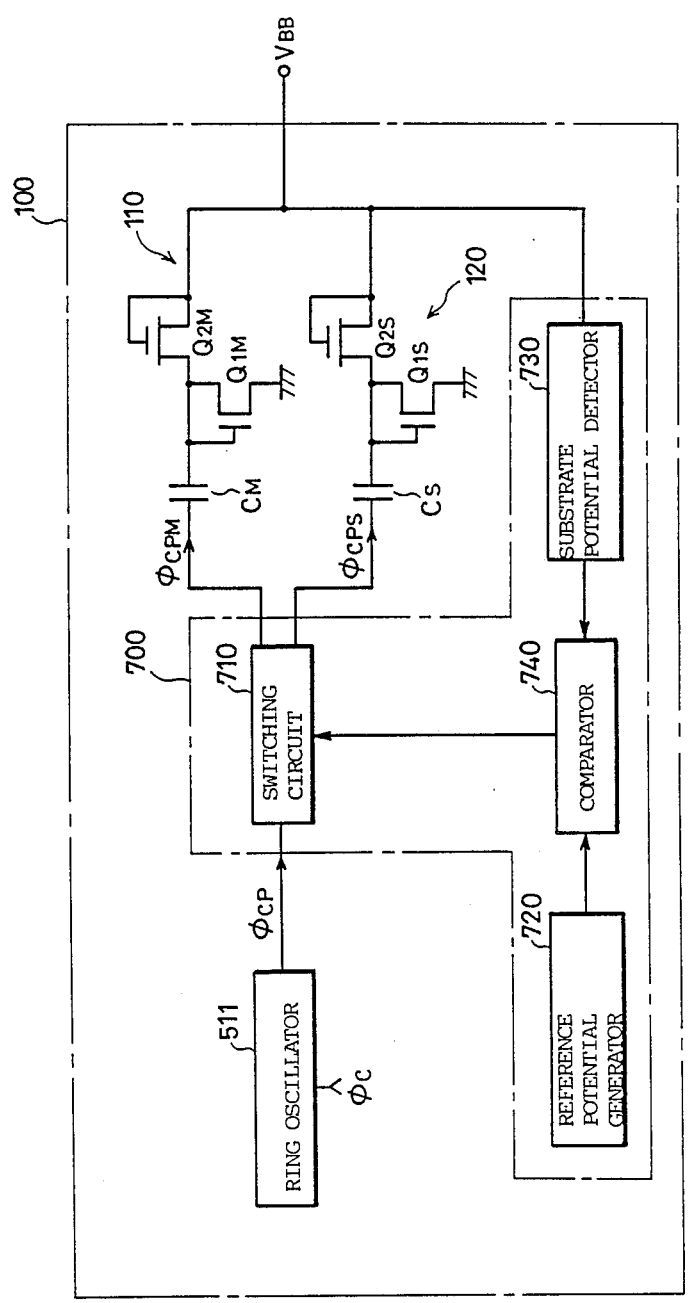
FIG. 23 is is a view showing a still another example of the substrate bias generator illustrated in FIG. 4.

FIG. 23 is a diagram showing a construction of a substrate bias potential generating circuit according to another embodiment of the invention. The construction of FIG. 23 includes a control circuit 700 for alternatively operating the bias generating circuits 110 and 120. The control circuit 700 includes a reference potential generating circuit 720 for generating a reference potential of a predetermined level, a comparing circuit 740 for comparison with the output of the substrate potential detecting circuit 730, and a switching circuit 710 for transmitting the oscillation signal $\phi_{CP}$ from the ring oscillator 511 to either of the substrate bias potential generating circuits 110 and 120 in response to the output of the comparing circuit 740.

The substrate potential detecting circuit 730 has a high input impedance through which the substrate potential is detected. Such high input impedance for substrate potential detection has the following advantage. According to the substrate potential detecting circuit as shown in FIG. 20, when MOS transistors Q3 and Q4 are both turned on, current flow takes place from the power supply Vcc into the substrate. Even though the conductance of the transistor Q3 is made as small as possible in order to constrain such current flow, leak current into the substrate can not be completely eliminated. The leak current flowing into the substrate makes the substrate bias voltage small in absolute value to make shallow the substrate bias. The shallow substrate bias operates the substrate bias generating circuit 110 having larger biasing capability. Thus, the main biasing circuit 110 operates in response to the leak current through the potential detecting circuit itself. This leads to the problem that the potential detecting circuit itself serves to make the substrate bias shallow to operate the main biasing circuit 110 unnecessarily.

To the contrary, in the structure shown in FIG. 23, the substrate potential is detected through the input having a high impedance so that the substrate potential can be precisely detected without any adverse effect to the substrate potential. The substrate potential thus detected is compared with an internally generated negative reference potential. Either one of the biasing circuits 110 and 120 is operated according to the comparison result. Thus, the biasing circuits with different biasing capability are selectively and appropriately operated precisely depending on the substrate potential so that reduced power consumption can be implemented.

Figure 24:
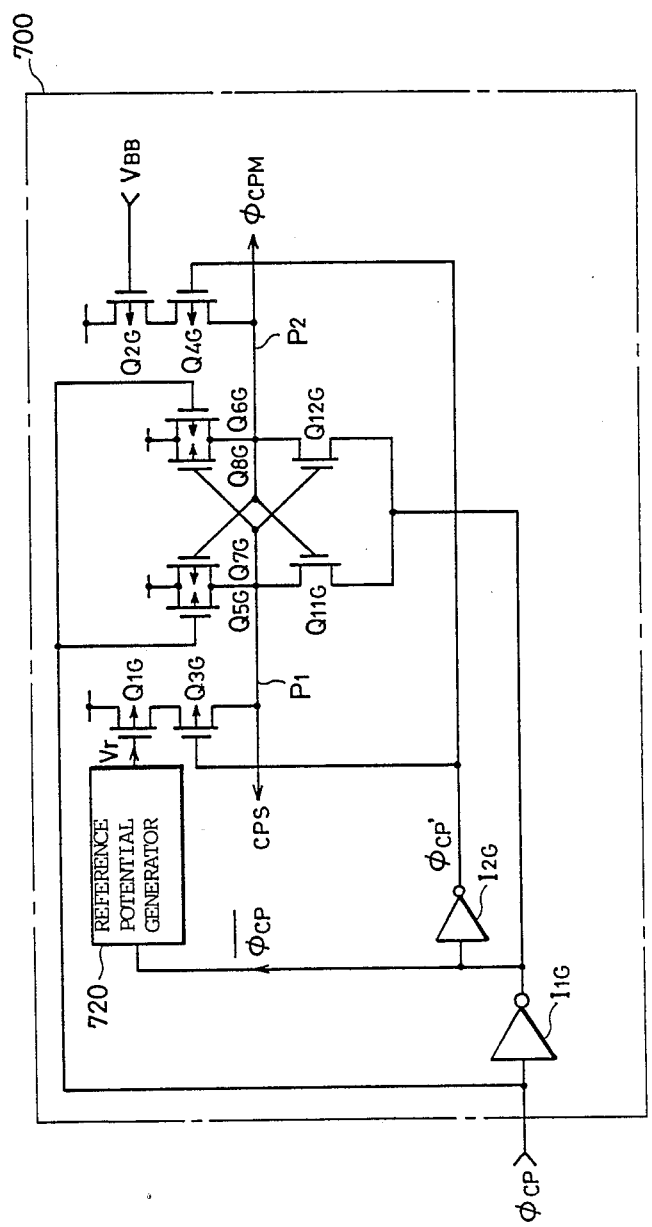
FIG. 24 is a view showing an example of the selection controller illustrated in FIG. 23.

FIG. 24 is a diagram showing an example of a specific construction of the selection control circuit 700 shown in FIG. 23. Referring to FIG. 24, the selection control circuit 700 comprises: a reference potential generating circuit 720 for generating a reference potential which attains the predetermined level more rapidly compared with the substrate potential after turn-on of the power supply; a p channel MOSFET Q1G for detecting an output potential Vr of the reference potential generating circuit; a p channel MOSFET Q2G for detecting the substrate potential $V_{BB}$; and MOSFETs Q7G, Q8G, Q11G and Q12G for generating signals for inactivating one of the substrate bias potential generating circuits and activating the other substrate bias potential generating circuit in response to the detection outputs of the MOSFETs Q1G and Q2G. The transistors Q7G, Q8G, Q11G and Q12G constitute a CMOS flip-flop differential amplifier which generates signals, according to the outputs of the detection by MOSFETs Q1G and Q2G, at output nodes P1 and P2. The output nodes P1 and P2 output the oscillation signals $\phi_{CPS}$ and $\phi_{CPM}$ to be applied to the first substrate bias potential generating circuit 120 having the smaller bias capability and the second substrate bias potential generating circuit 110 having the larger bias capability, respectively.

There are provided p channel MOSFETs Q3G and Q4G between the detection MOSFETs Q1G and Q2G and the output nodes P1 and P2, respectively. The MOSFETs Q3G and Q4G function as cut-off transistor for preventing current from flowing from the power supply potential Vcc to the output nodes P1 and P2 when the detection transistors Q1G and Q2G are turned on. There are provided p channel MOSFETs Q5G and Q6G in parallel with the MOSFETs Q7G and Q8G, respectively, to precharge the output nodes P1 and P2 to a predetermined potential level. The oscillation signal $\phi_{CP}$ is applied from the ring oscillator 511 to the gates of the MOSFETs Q5G and Q6G. Accordingly, when the oscillation signal $\phi_{CP}$ falls to L level, the MOSFETs Q5G and Q6G are turned on to precharge the nodes P1 and P2 to the level of the power supply potential Vcc. The oscillation signal $\phi_{CP}$, is applied to the respective one conduction terminals (sources) of the n channel MOSFETs Q11G and Q12G through the inverter Q2G so that the flip-flop differential amplifier (i.e., the circuit formed by the MOSFETs Q7G, Q8G, Q11G and Q12G) is activated.

An internal control signal $\phi_{CP}$, is applied to the gates of the MOSFETs Q3G and Q4G which function as cutoff transistors. The internal control signal $\phi_{CP}$, is formed by causing the oscillation signal $\phi_{CP}$ from the ring oscillator 511 to pass through the inverters I1G and I2G.

Figure 25:
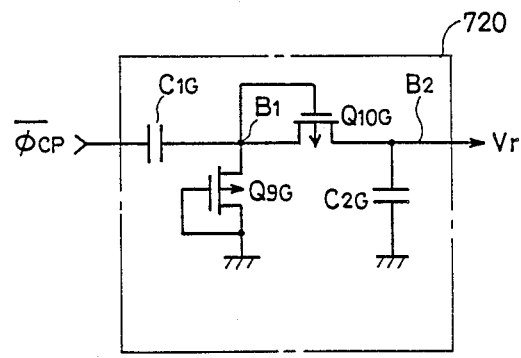
FIG. 25 is a view showing an example of the reference potential generator illustrated in FIG. 24.
Figure 26:
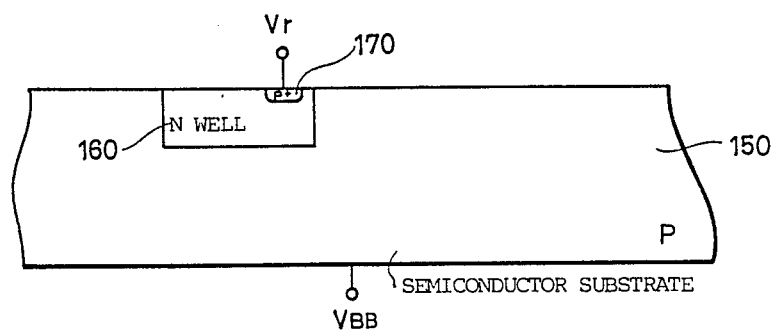
FIG. 26 is a view showing the relationship between the substrate bias potential generator to which the reference potential from the reference potential generator is applied and the semiconductor substrate to which the substrate bias potential is applied.

The reference potential generating circuit 720 for forming the reference potential Vr has a construction as shown in FIG. 25. Referring to FIG. 25, the reference potential generating circuit 720 includes a charge pump capacitor C1G, p channel MOSFETs Q9G and Q10G which cooperates with the charge pump operation of the capacitor C1G and clamps the potential of the node B1 to the predetermined potential, and a parasitic capacitance C2G. The p channel MOSFET Q9G is provided between the node B1 and the ground potential and it clamps the potential of the node B1 at the threshold voltage level thereof. The p channel MOSFET Q10G is provided between the node B1 and an output node B2 and it clamps the potential of the node B1 at a value determined by the threshold voltage thereof and the reference potential Vr. The P channel MOSFETs Q9G and Q10G are both diode-connected. The reference potential generating circuit 720 is formed in an n type well region 160 formed on the surface of the p type semiconductors substrate 150, as shown in FIG. 26, since its components are a capacitor and p channel MOSFETs. The parasitic capacitance C2G includes a junction capacitance between its circuit element and the n type well 160, a junction capacitance formed between the p type region 150 and the n type well region 160, and the like.

The output Vr from the reference potential generating circuit 720 is applied to the p+ type impurity region 170 formed in the n type well 160 to bias the p+ impurity region 170 to a predetermined level according to the potential of the power supply. The reference potential Vr has a negative polarity in the same manner as the reference bias potential $V_{BB}$ applied to the semiconductor substrate 150. The signal $\overline{\phi_{CP}}$ for operating the reference potential generating circuit 720 is applied through the inverter I20.

Figure 27:
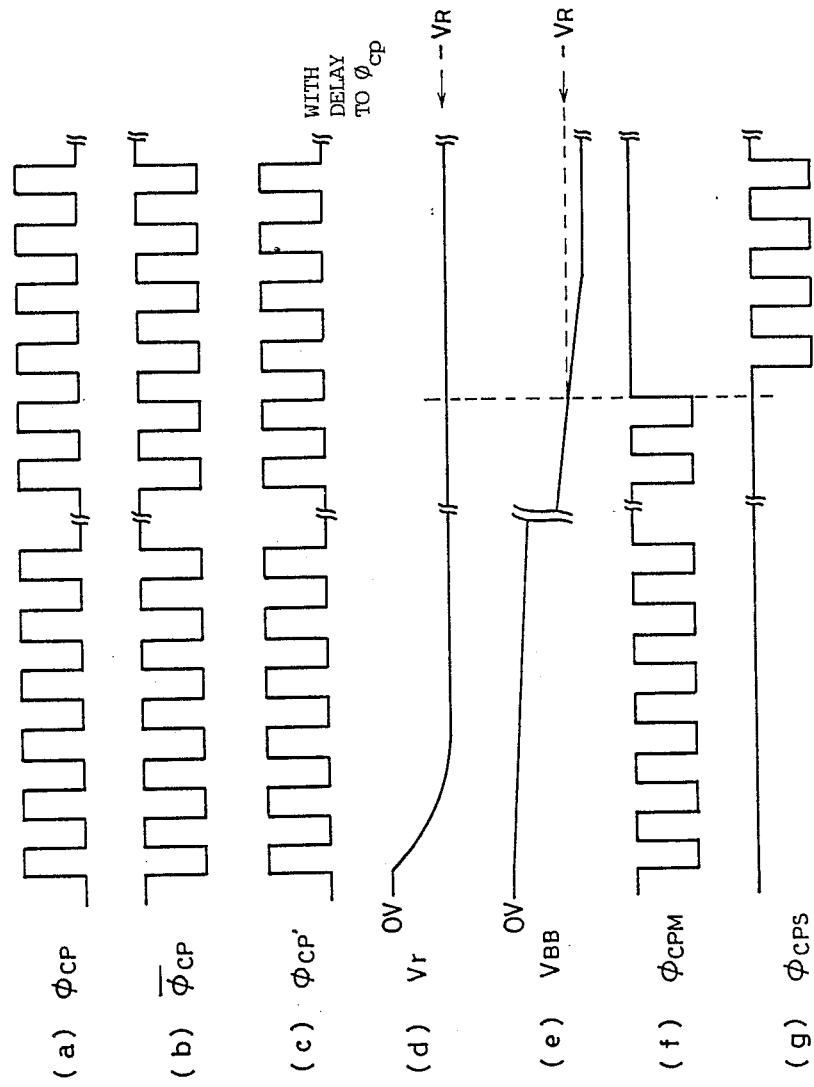
FIG. 27 is a signal waveform diagram showing the action of the selective controller illustrated in FIG. 24.

FIG. 27 is a signal waveform diagram showing operation of the substrate bias potential generating circuit shown in FIG. 24. Referring to FIGS. 24 to 27, operation of the substrate bias potential generating circuit according to the embodiment of the invention will be described in the following.

Although it is not directly related to self-refresh mode operation, transient operation occurring immediately after turn-on of power supply is described for better understanding of the operation of the control circuit 700.

In an initial state such as turn-on of power supply, the reference potential Vr and the substrate bias potential $V_{BB}$ are both at ground level of 0V. In response to the turn-on of power supply, the ring oscillator 511 shown in FIG. 19 must begin the oscillation thereof to rapidly decrease the substrate potential down to a predetermined potential. To this end, the ring oscillator 11 is so structured to operate in normal operation mode, as shown in FIG. 10. Such structure for operating the ring oscillator 511 in normal operation mode is realized by the construction that the signal $\phi_C$ is kept at "H" level during "L" level of the signal $\phi_S$ to activate the substrate bias generating circuit 100, as shown in FIG. 10.

In an initial state such as in turn-on of the power supply for the semiconductor memory device, when the ring oscillator 511 shown in FIG. 10 starts oscillating operation in response to the turn-on of the power supply, the reference potential Vr outputted from the reference potential generating circuit 720 rapidly attains the predetermined level $-V_R$. On the other hand, the substrate bias potential $V_{BB}$ applied to the semiconductor substrate 150 attains slowly a predetermined bias level compared with the fall of the reference potential Vr. A time difference in lowering of the reference potential Vr and the substrate bias potential $V_{BB}$ is caused by the below described reasons. The reference potential generating circuit 720 is formed in the n type well region 160. In order to generate the reference potential Vr, the potential of the p+ type impurity region 170 of a small volume formed in the n type well region 160 is lowered. Thus, the reference potential can rapidly attain the predetermined bias potential $-V_R$. On the other hand, in order to lower the potential of the semiconductor substrate 150 to the predetermined potential, it is necessary to lower the potential of the whole semiconductor substrate 150. In view of a ratio of capacities (about several thousands times as much) of the p+ type impurity region 170 and the semiconductor substrate 150, a relatively long time (about several hundreds of micro seconds) is required to lower the potential of the semiconductor substrate 150. Accordingly, in the initial state in which the reference potential Vr is larger than the substrate bias potential $V_{BB}$ in terms of the absolute value, the impedance of the MOSFET Q1G becomes smaller than that of the MOSFET Q2G. When the oscillation signal $\phi_{CP}$ falls to L level, the precharge MOSFETs Q5G and Q6G are turned on and the output nodes P1 and P2 are precharged to H level as the level of the power supply potential Vcc. At this time, the output signal $\overline{\phi_{CP}}$ from the inverter I1G is at H level and accordingly the flip-flop differential amplifier formed by the MOSFETs Q7G, Q8G, Q11G and Q12G does not operate.

Next, when the oscillation signal $\phi_{CP}$ rises to H level, the precharge transistors Q5G and Q6G are turned off and the precharge operation of the nodes P1 and P2 is stopped. At this time, since the oscillation signal $\phi_{CP}$ is transmitted to the cutoff MOSFETs Q3G and Q4G through the inverters I1G and I2G, respectively, the signal $\phi_{CP'}$ is transmitted with a delay to the oscillation signal $\phi_{CP}$ corresponding to a delay time in the two stages of inverters IL and I2G. Accordingly, the MOSFETs Q3G and Q4G are turned off with a delay corresponding to this delay time from the turn-off of the precharge transistor MOSFETs Q5G and Q6G. When the output signal $\overline{\phi_{CP}}$ of the inverter I1G falls to L level in the above described state, the MOSFETs Q3G and Q4G for cut-off are still in the on state and accordingly a potential difference is produced between the nodes P1 and P2. Consequently, the flip-flop differential amplifier formed by the MOSFETs Q7G, Q8G, Q11G and Q12G operates to change the potential level of the output node P1 to H level and the output level of the output node P2 to L level. Then, when the oscillation signal $\phi_{CP}$ falls to L level, the output nodes P1 and P2 are precharged to the predetermined power supply potential level in the same manner as described previously. This operation is repeated and if the reference potential Vr is larger than the substrate bias potential $V_{BB}$ in terms of the absolute value, the output signal $\phi_{CPS}$ from the output node P1 rises to H level, in response to the oscillation signal $\phi_{CP}$, and the output signal $\phi_{CPM}$ from the output node P2 becomes an oscillation signal corresponding to the oscillation signal $\phi_{CP}$. Thus, the substrate bias potential generating circuit 120 shown in FIG. 19 does not operate and the substrate bias potential generating circuit 110 having the larger bias capability operates, thereby to lower the potential of the semiconductor substrate 150 rapidly to the predetermined potential level.

In the waveform diagram of FIG. 27, the signals $\phi_{CP}$ and $\phi_{CP'}$ are represented as having waveforms of the same phase for the purpose of simplification of the illustration; however, in practice, the signal $\phi_{CP'}$ changes with a delay from the signal $\phi_{CP}$, corresponding to a delay time by the inverters of IL and I2G.

In the above described operation, the ring oscillator 511 is explained to operate immediately after turn-on of power supply. However, in the case that the ring oscillator 511 (511') is activated in response to the control signal $\phi_C$ in the self refresh mode, when the reference potential Vr from the reference potential generating circuit 720 is greater in terms of the absolute value than the substrate biased potential $V_{BB}$, that is, when the substrate bias is shallow, the above developed description holds. That is, when the ring oscillator 511 performs oscillating operation in the self refresh mode, the substrate biased potential can be rapidly decreased to a predetermined level in response to the detection signal from the substrate potential detecting circuit 730 so that more stable supply of the substrate bias can be implemented.

When the potential of the semiconductor substrate 150 becomes larger than the reference potential Vr in terms of the absolute value, the signal $\phi_{CPS}$ becomes an oscillation signal corresponding to the oscillation signal $\phi_{CP}$ and the signal $\phi_{CPM}$ is fixed to a H level, oppositely to the above described operation. As a result, when the bias potential of the semiconductor substrate becomes larger than the predetermined reference potential $-V_R(=Vr)$ in terms of the absolute value, the first substrate bias potential generating circuit 120 having the smaller bias capability operates. In the above described construction, not only after a sufficient rise of the power supply potential but also immediately after turn-on of the power supply potential, either substrate bias potential generating circuit can be operated dependent on its bias capability according to the potential of the semiconductor substrate and thus consumption of power can be reduced.

In addition, in the above described construction, the gate electrode of the MOSFET Q2G is connected to the semiconductor substrate in order to detect the potential $V_{BB}$ of the semiconductor substrate and accordingly the substrate potential detecting circuit detects the substrate potential through the input having the high input impedance. Consequently, the substrate potential detecting circuit itself does not exert any adverse effect on the potential of the semiconductor substrate, such as leakage current into the substrate, and only either substrate bias potential generating circuit can be operated correctly in response to the potential of the semiconductor substrate.

Figure 28:
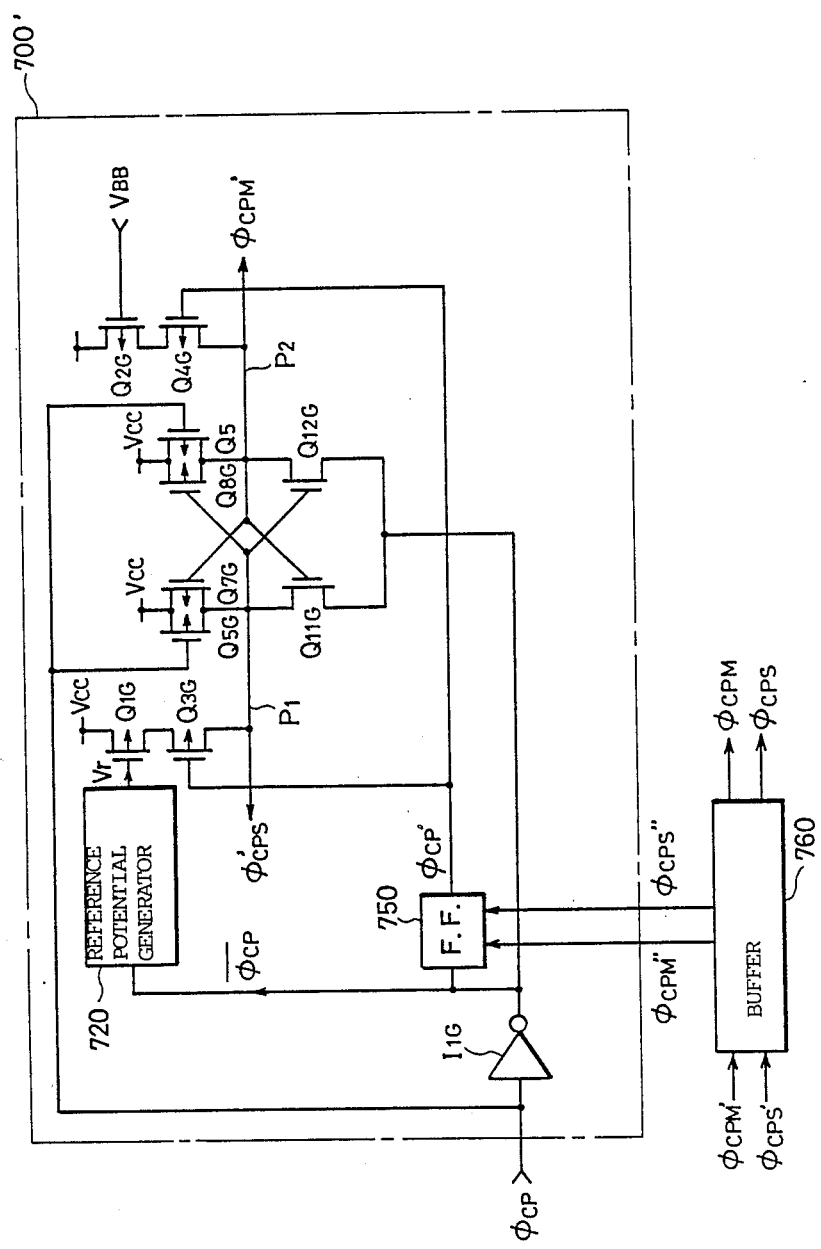
FIG. 28 is a view showing a still another example of the selective controller illustrated in FIG. 23.

FIG. 28 is a diagram showing another construction example of the selection control circuit shown in FIG. 24. In FIG. 28, the portions corresponding to those in FIG. 24 are denoted by the same reference characters.

In the construction of FIG. 28, the control signal $\phi_{CP'}$ for controlling operation of the MOSFETs Q3G and Q4G for cut-off is generated by a flip-flop 750 in place of the inverter I2G shown in FIG. 24. The flip-flop 750 receives a signal $\phi_{CP}$ from the inverter I1G and signals $\phi_{CPS}''$ and $\phi_{CPM}''$ from the buffer circuit 760. The buffer circuit 760 outputs not only the operation control signals $\phi_{CPM}''$ and $\phi_{CPS}''$ for the flip-flop 750 but also the operation control signals $\phi_{CPM}$ and $\phi_{CPS}$ for the substrate bias potential generating circuit 110 and 120 in response to the signals $\phi_{CPM}$, and $\phi_{CPS}$, from the comparison detecting circuit 700'.

The comparison detecting circuit 700' has the same construction as that of the selection control circuit 700 of FIG. 23 and it compares the reference potential Vr from the reference potential generating circuit 720 and the substrate potential $V_{BB}$ and outputs signals $\phi_{CPM}$, and $\phi_{CPS}$, according to the result of the comparison.

Figure 29:
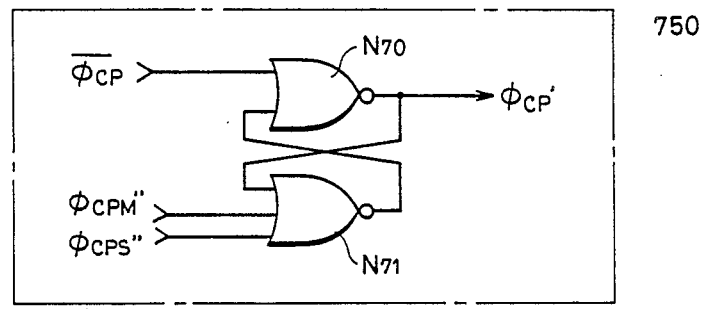
FIG. 29 is a view showing an example of the flip-flop illustrated in FIG. 28.

A concrete construction example of the flip-flop 750 is shown in FIG. 29. Referring to FIG. 29, the flip-flop 750 includes two NOR gates N70 and N71. The NOR gate N70 receives the signal $\phi_{CP}$ from the inverter I2G and the output of the NOR gate N71. The NOR gate N71 receives the two control signals $\phi_{CPM}''$ and $\phi_{CPS}''$ from the buffer circuit 760 and the output of the NOR gate N70. The NOR gate N70 outputs the signal $\phi_{CP'}$ for controlling the operation of the MOSFETs Q3G and Q4G for current cutoff. In the flip-flop 750, the output signal $\phi_{CP'}$ is reset to L level if the signal $\phi_{CP}$ is at H level.

Figure 30:
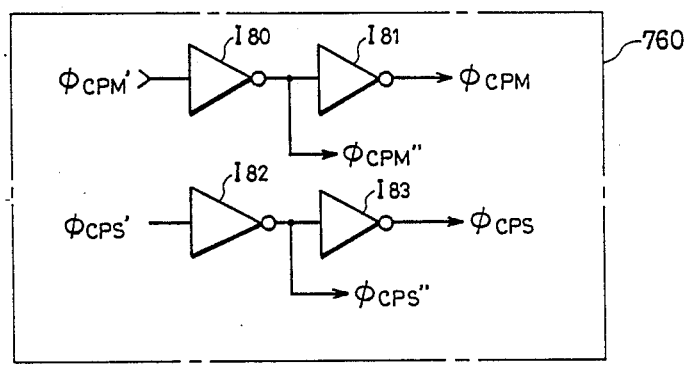
FIG. 30 is a view showing an example of the buffer circuit illustrated in FIG. 28.

FIG. 30 is a diagram showing a specific construction example of the buffer circuit 760 shown in FIG. 28. Referring to FIG. 30, the buffer circuit 760 comprises a path for outputting the signal $\phi_{CPM}$ for controlling the operation of the substrate bias potential generating circuit 110 having the larger bias capability, and a path for outputting the signal $\phi_{CPS}$ for controlling the operation of the substrate bias potential generating circuit 120 having the smaller bias capability. The path for outputting the signal $\phi_{CPM}$ includes two stages of inverters I80 and I81 cascade-connected for receiving the signal $\phi_{CPM}$, from the output node P2 of the comparison detecting circuit 700'. The inverter I80 outputs the signal $\phi_{CPM}''$ for controlling the operation of the flip-flop 750 and the inverter I81 outputs the signal $\phi_{CPM}$ for controlling the operation of the substrate bias potential generating circuit 110.

The path for outputting the signal $\phi_{CPS}$ includes two stages of inverters I82 and I83 cascade-connected for receiving the signal $\phi_{CPS}$, from the output node P1 of the comparison detecting circuit 700'. The inverter I82 outputs the signal $\phi_{CPS}''$ for controlling the operation of the flip-flop 750 and the inverter I83 outputs the signal $\phi_{CPS}$ for controlling the operation of the substrate bias potential generating circuit 120. Referring now to FIGS. 28 to 30, operation of a bias potential switching circuit according to another embodiment of the invention will be described.

First, let us assume a case in which the output signal $\phi_{CP}$ from the inverter I1G is at H level while the ring oscillator 511 effects oscillating operation. In this case, the flip-flop 750 is in the reset state. More specifically, since the signal of H level is inputted to the one input of the NOR gate N70, a signal of L level is outputted from the NOR gate N70 independent of $\phi_{CPM}''$ and $\phi_{CPS}''$. In response thereto, the MOSFETs Q3G and Q4G for cutoff are both in the on state. The output nodes P1 and P2 are precharged to H level.

Then, when the output signal $\phi_{CP}$ from the inverter I1G changes to L level, the flip-flop differential amplifier of the CMOS structure formed by the MOSFETs Q7G, Q8G, Q11G and Q12G is activated to start comparison between the reference potential Vr from the reference potential generating circuit 720 and the substrate bias potential $V_{BB}$. Since the output nodes P1 and P2 have been precharged at H level through the MOSFETs Q5G and Q6G respectively, before activation of the differential amplifier, the signals $\phi_{CPM}'$ and $\phi_{CPS}'$ from the output nodes P1 and P2 are both raised to H level and consequently the output signals $\phi_{CPM}''$ and $\phi_{CPS}''$ from the buffer circuit 760 are both lowered to L level. Accordingly, in the initial activation state of the flip-flop differential amplifier of the CMOS structure (namely in a state in which a potential difference between the reference potential Vr and the substrate bias potential $V_{BB}$ is not increased), the flip-flop 750 is maintained in the reset state and the output signal $\phi_{CP'}$ is maintained at L level. Consequently, even if the flip-flop differential amplifier of the CMOS structure is activated, the MOSFETs Q3G and Q4G for cutoff are both in the on state.

Next, when the potential levels of the node P1 and P2 are fixed to H level and L level, respectively, according to the result of the comparison between the reference potential Vr and the substrate bias potential $V_{BB}$ as a result of the operation of the differential amplifier, either one of the output signals $\phi_{CPM}''$ and $\phi_{CPS}''$ from the buffer circuit 760 rises to H level. As a result, the flip-flop 750 is set and the output signal $\phi_{CP'}$ rises to H level. More specifically, when one input of the NOR gate N71 attains H level, the output of the NOR gate N71 falls to L level accordingly. As a result, both inputs of the NOR gate N70 fall to L level and thus the output signal $\phi_{CP'}$ rises to H level. In response to the signal $\phi_{CP'}$ of H level, the MOSFETs Q3G and Q4G for cutoff are both turned off, thereby to cut off the path through which the penetration current flows from the power supply potential Vcc to the output nodes P1 and P2 through the MOSFETs Q1G and Q2G for detection. On the other hand, the potential levels of the output nodes P1 and P2 are outputted as the control signals $\phi_{CPM}$ and $\phi_{CPS}$ from the buffer circuit 760 and those signals are transmitted to the first and second substrate bias potential generating circuits 110 and 120.

When the oscillation signal $\phi_{CP}$ falls again to L level and the output signal $\phi_{CP}$ from the inverter I1G rises to H level, the flip-flop 750 is reset and the output nodes P1 and P2 are precharged to H level as the power supply potential level. By repeating this operation, only either one of the substrate bias potential generating circuits is activated dependent on the difference between the substrate potential and the reference potential.

In the case of the construction shown in FIG. 24, it is considered that the MOSFETs Q3G and Q4G might be turned off before the difference between the reference potential Vr and the substrate bias potential $V_{BB}$ is detected, dependent on the detection sensitivity of the CMOS flip-flop type differential amplifier formed by the MOSFETs Q7G, Q8G, Q11G and Q12G in cases where the reference potential Vr from the reference potential generating circuit 720 becomes very close to the value of the substrate bias potential $V_{BB}$. This is because the MOSFETs Q3G and Q4G for cutoff are turned off with predetermined timing independent of the detection operation of the differential amplifier, namely, the output levels of the output nodes P1 and P2 since the operation of the cutoff MOSFETs Q3G and Q4G is simply controlled by the delay time by the inverters I1G and I2G. Thus, if the cutoff MOSFETs Q3G and Q4G are turned off before the difference between the substrate potential $V_{BB}$ and the reference potential Vr is detected, the potential levels of the output nodes P1 and P2 are both at intermediate levels and it might happens that penetration current flows continuously from the power supply potential Vcc to the ground potential level through the CMOS flip-flop differential amplifier during the period of H level of the oscillation signal $\phi_{CP}$. However, if the flip-flop 750 is used in place of the inverter for delay as shown in FIG. 28, the CMOS flip-flop differential amplifier is activated and the cutoff MOSFETs Q3G and Q4G can be turned off after the potential levels of the output nodes P1 and P2 are fixed to the level obtained by differential amplification of the difference between the reference potential Vr and the substrate bias potential $V_{BB}$. Accordingly, the time required for the potential levels of the output nodes P1 and P2 to attain the intermediate level can be minimized and, a period in which penetration current flows in the CMOS flip-flop differential amplifier can be made very small, making it possible to further reduce consumption of current and to detect reliably the difference between the reference potential Vr and the substrate bias potential $V_{BB}$.

Figure 31:
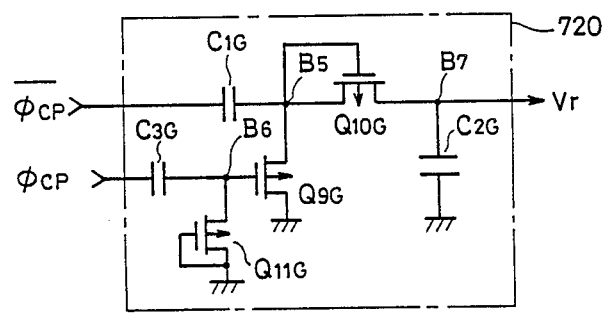
FIG. 31 is a view showing another example of the reference potential generator illustrated in FIG. 24 and 28.

FIG. 31 is a diagram showing another construction example of a reference potential generating circuit. Referring to FIG. 31, the reference potential generating circuit 720 comprises: a charge pump capacitor C1G for receiving an oscillation signal $\overline{\phi_{CP}}$; a p channel MOSFET Q10G for clamping the potential of the node B5 to a value according to the difference between the reference potential Vr and the threshold voltage Vt of the MOSFET Q10G; a p channel MOSFET Q9G for clamping the potential of the node B5 to the ground potential level; a capacitor C3G and a p channel MOSFET Q11G for controlling the clamping operation of the MOSFET Q9G; and a parasitic capacitance C2G formed between one conduction region (impurity region) of the MOSFET Q10G and the semiconductor substrate (the n type well region in this example). The gate of the MOSFET Q9G is connected to the charge pump capacitor C3G which receives the oscillation signal $\phi_{CP}$.

The diode-connected p channel MOSFET Q11G is provided at a node of connection of the capacitor C3G and the gate of the MOSFET Q9G, namely, between the node B6 and the ground potential.

In the construction of the reference potential generating circuit shown in FIG. 25, the reference potential Vr generated therein is a level of $-(Vcc-Vt(9G)-Vt(10G))$ where Vt(9G) and Vt(10G) are absolute values of the threshold voltages of the MOSFETs Q9G and Q10G, respectively. Accordingly, in the construction shown in FIG. 25, the potential to be attained by the reference potential Vr cannot be made smaller than the above indicated value, namely, cannot be made larger than that in terms of the absolute value. However, in the construction shown in FIG. 31, the value of the reference potential Vr can be set to a lower potential. In the following, operation of the reference potential generating circuit shown in FIG. 31 will be briefly described. If the oscillation signal $\phi_{CP}$ is at H level, the potential of the node B6 tends to rise to H level due to capacitance coupling of the capacitor C3G; however, by the function of the MOSFET Q11G, the potential of the node B6 is clamped to a level near to the ground potential level $|Vt(11G)|$. Then, when the operation signal falls to L level and the complementary oscillation signal $\overline{\phi_{CP}}$ rise to H level, the potential of the node B5 tends to rise H level, while the potential of the node B6 is lowered to a negative potential. At this time, if the capacitance of the capacitor C3G and the threshold voltage of the MOSFET Q11G are set to enable the potential of the node B6 to be lower than the threshold voltage Vt(9G) of the MOSFET Q9G, the MOSFET Q9G is completely conducted and the potential level of the node B5 is clamped to the ground potential level. Accordingly, when the complementary oscillation signal $\overline{\phi_{CP}}$ falls to L level next, the potential of the node B5' becomes $-(Vr-Vt(10G))$ level. In the case of lowering the potential of the node B5, the complementary signal $\overline{\phi_{CP}}$ falls to L level. However, in that case, the oscillation signal $\phi_{CP}$ rises to H level at the same time and accordingly independent of the clamping operation of the MOSFET Q11G, the potential level becomes higher than the threshold voltage level of the MOSFET Q9G, whereby the MOSFET Q9G is turned off. Accordingly, the attainable potential level of the node B5 is $-(Vr-Vt(10G))$. If the oscillation signal $\phi_{CP}$ is continuously applied, the attainable potential of the reference potential Vr can be lower to $-(Vcc-Vt(10G))$. Assuming that the threshold voltages of the MOSFETs Q9G and Q10G are $-1.5V$ and that the operation power supply potential Vcc is 5V, the attainable potential of the reference potential Vr is $-2V$ in the case of the construction of the reference potential generating circuit shown in FIG. 25, while the attainable potential of the reference potential Vr can be set to $-3.5V$ in the case of the reference potential generating circuit shown in FIG. 31.

Figure 32:
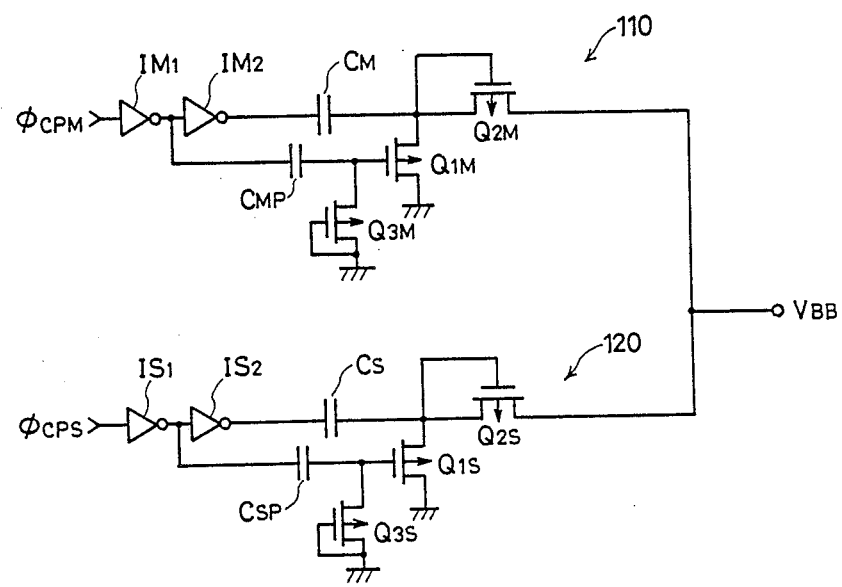
FIG. 32 is a view showing still another example of the bias circuit illustrated in FIGS. 19 and 23.

If the reference potential generating circuit shown in FIG. 31 is applied to the substrate bias potential generating circuit, the substrate bias potential generating circuit of the construction as shown in FIG. 32 can be obtained. Referring to FIG. 32, the substrate bias potential generating circuit 110 having the larger bias capability includes two stages of inverters $I_{M1}$ and $I_{M2}$ which are cascade-connected for receiving the oscillation signal $\phi_{CPM}$, a charge pump capacitor $C_M$ connected to an output of the inverter $I_{M2}$, a charge pump capacitor $C_{MP}$ connected to an output of the inverter $I_{M1}$, and p channel MOSFETs $Q_{1M}$, $Q_{2M}$ and $Q_{3M}$ for generation of the substrate potential. The MOSFETs $Q_{1M}$, $Q_{2M}$ and $Q_{3M}$ have the same function and the same connection construction as the MOSFETs Q9G, Q10G and Q11G shown in FIG. 31.

The substrate bias potential generating circuit 120 having the smaller bias capability includes two stages of inverters $I_{S1}$ and $I_{S2}$ cascade-connected for receiving the oscillation signal $\phi_{CPS}$, a capacitor $C_{SP}$ for carrying out charge pump operation according to an output of the inverter $I_{S1}$, a capacitor $C_S$ for carrying out charge pump operation according to an output of the inverter $I_{S2}$, and p channel MOSFETs $Q_{1S}$, $Q_{2S}$ and $Q_{3S}$ for generating a predetermined bias potential level according to the charge pump operation of the capacitors $C_S$ and $C_{SP}$. The MOSFETs $Q_{1S}$, $Q_{2S}$ and $Q_{3S}$ have the same function and the same connection structure as the MOSFETs Q9G, Q10G and Q11G shown in FIG. 31. Accordingly, in the case of the construction of the substrate bias potential generating circuit shown in FIG. 32, it is possible to set the substrate bias potential $V_{BB}$ to $-(Vcc-Vt)$ in the same manner as in the reference potential generating circuit shown in FIG. 31. In this case, the threshold voltage Vt is an absolute value of the threshold voltage of the p channel MOSFETs $Q_{2M}$ and $Q_{2S}$. Accordingly, by using this structure, it becomes possible to bias the semiconductor substrate deeper and to reduce the parasitic capacitance of the semiconductor memory device. Thus, the semiconductor memory device can be operated with high reliability at high speed.

In the above described embodiment, if the conductivity type of the MOSFETs included in the substrate bias potential generating circuit is opposite to that indicated above, the same effects can be obtained.

In addition, as shown in FIG. 2, selective activation of the substrate bias potential generating circuits is effected by using the NOR gate. However, a NAND gate may be used in place thereof. Similarly, although the construction using the NOR gate is shown as the flip-flop 750 shown in FIG. 28, other gate structure such as a NAND gate may be used in place thereof.

In addition, although the construction of the substrate bias potential generating circuits in the semiconductor memory device was described in the foregoing embodiments, a semiconductor integrated circuit device where a predetermined bias potential is generally applied to a semiconductor substrate may be used.

Furthermore, the semiconductor substrate may be a semiconductor layer or a well region having a surface where circuit elements are formed, insofar as predetermined bias potential can be applied thereto.

Regarding the refresh intervals and number of refresh cycles on the self-refresh mode, the standard value (for example, 8ms/512 cycles for 1M bit DRAM, 16ms/1024 cycles for 4M bit DRAM, and 32 ms/1024 cycles for 16M bit DRAM) have been used in the foregoing description. However, the consumption power in the refresh mode can be further reduced by setting these parameters at larger values within the limits not affecting the memory cell data (for example, 32 ms/2048 cycles or 256 ms/4096 cycles for 4M DRAM). Such prolongation of the refresh interval and decrease of the number of refresh cycles can be implemented by increasing the maximum count of the refresh address counter 94 or setting the timer 93 for deriving the refresh enable signal to a longer oscillation frequency.

Furthermore, while in the above embodiment the timer 923 is used for the generation of a refresh instruction signal (in the case of $\overline{CAS0}$ before $\overline{RAS0}$ refresh mode; See FIG. 6) aside from the timer 93 for derivation of the refresh enable signal, the timer 923 and timer can be integrated as a common timer by employing binary counters and a ring oscillator.

As to the number of stages of the ring oscillator for deriving a signal having an optional oscillation frequency, too, it can be set at an appropriate value for securing the desired oscillation frequency.

The same is true with the number of stages of the inverters for the waveform shaping of the oscillator output signal and in some cases, they may even be omitted.

Furthermore, the number of stages of the binary counters 93-3 (FIG. 8) used in the timer 93 for the derivation of the refresh enable signal can also be varied according to the intended application.

FIGS. 8 through 10 show the construction in which the control signal $\phi_C$ for the intermittent operation of the substrate bias circuit is generated from the oscillation signals $\phi_r$ and $\phi_R$ in the timer 93. However, it may be so arranged, for instance, that the control signal $\phi_C$ is generated using the complimentary output 01 from the first stage of the binary counter within the timer and the true output signal $\phi_R$ from the last stage or the complementary output 02 from the second stage and the output signal $\phi_R$ from the last stage. In such arrangement, the pulse width of control signal $\phi_C$ in FIG. 11B can be set at, say, twice or 4 times as great. Thus, the pulse width of control signal $\phi_C$ can be set at an appropriate value according to the consumption power and biasing capacity of the substrate bias generator in the random access memory.

Thus, in accordance with this invention, the substrate bias generator can be driven intermittently in the self-refresh mode to eliminate the unnecessary power consumption, thus enabling a low-power-consuming dynamic random access memory.

The unnecessary power consumption can be further trimmed off and a DRAM with still lower power consumption can be implemented by the construction wherein, in the self-refresh mode, the substrate bias generator is driven only during the time when the RAM is operating in each refresh cycle.

Furthermore, the selective actuation of two substrate bias generators with dissimilar capacities reduces bias generators with dissimilar capacities reduces the power consumption in a still more efficient manner.

Moreover, by controlling the selective actuation of such two different substrate bias generators using the output of a circuit which detects the substrate potential through an input with high impedance, the substrate bias generators can be driven with greater precision and selectivity, thus contributing further to reduce power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device formed on a semiconductor substrate (150) and having a self-refresh function by which memory cell data therein are automatically refreshed in response to an external refresh instruction signal, comprising:

means (91) for generating an internal refresh instruction signal $\phi_S$ in response to an external refresh instruction signal (REF; $\overline{RAS}$ $\overline{CAS}$, means (94, 95, 96, 98) for refreshing said memory cell data, means (92, 93) for generating a signal ($\phi_R$) for enabling said data refresh means in response to said internal refresh instruction signal, said enabling signal being generated cyclically at a predetermined interval during the period of time when said internal refresh signal remains in activated state, means (100) for biasing said semiconductor substrate to a predetermined potential, and control means (99, 99,) for activating said biasing means for a time period shorter than said predetermined interval of said enabling signal in response to said refresh instruction signal and the state of activation of said enabling signal.

2. The memory device according to claim 1 wherein said control means includes means (99') for activating said biasing means for a time longer than the period of activated state of said activation signal.

3. The memory device according to claim 2, wherein said means (99') included in said control means activates said biasing means for a time period including the period of activated state of said activation signal.

4. The memory device according to claim 2, wherein said control means includes means (321, $I_C$, AN100) for, in response to said internal refresh instruction signal and said refresh activation signal, generating a signal for activating said biasing means and applying it to the same means and means ($I_{c1}$–$I_{c2}$m) for, in response to said refresh activation means, inactivating said biasing means activation signal generating means after lapse of a predetermined time following application of said refresh activation signal.

5. The memory device according to claim 1 wherein said control means includes means (99) for activating said biasing means for a period of time shorter than the period during which said refresh activation signal remains in activated state.

6. The memory device according to claim 5, wherein said means (99) included in said control means activates said biasing means for a time period included in the period during which said activation signal is in an active state.

7. The memory device according to claim 5, wherein said activation signal generating means include means (93-1, 93-2) for, in response to said internal refresh instruction signal, generating a pulse signal in a predetermined cycle and means (93-3) for counting said pulse signal and outputting said biasing means activation signal when the count reaches a predetermined value, and said biasing means activation means include means (9-1) for generating a set signal in response to said refresh activation signal, means (93-3) for generating said biasing means activation signal for a period of time defined by said pulse signal in response to said set signal when said internal refresh instruction signal is in activated state and generating said biasing means activation signal of active state continuously while said internal refresh instruction signal is in inactive state.

8. The memory device according to claim 1, wherein said biasing means includes, means (511) for generating a second activation signal, in response to said biasing activating signal, first and second potential generating means (110, 120) having different current supply capabilities, outputs of said first and second potential generating means being applied to said semiconductor substrate, means (610; 730) coupled to said semiconductor substrate for detecting a potential of said semiconductor substrate through said input, and means (600; 710, 720, 740) responsive to an output of said semiconductor substrate potential detecting means and said second activating signal, for selectively activating either said first or second, not both, potential generating means.

9. The memory device according to claim 8, wherein said selective activation means includes means (720) for generating a reference potential, means (740) for comparing the output of said substrate potential detecting means and the output of said reference potential generating means, and means (710) responsive to the output of said comparing means, for transmitting said second activation signal to either said first or second potential generating means, thereby activating only one of said first and second potential generating means.

10. The memory device according to claim 9, wherein said substrate potential detecting means has an input of high impedance coupled of said substrate and includes means (Q2G) for detecting said substrate potential through said input.

11. The memory device according to claim 8, wherein said selective activation means includes means (Q5G, Q6G, Q7G, Q8G, Q11G, Q12) for transmitting said second activation signal to the potential generating means (110) having the larger current supply capability out of said first and second potential generating means when the output of said comparing means indicates that an absolute value of the potential of said semiconductor substrate is smaller than an absolute value of said reference potential.

12. The memory device according to claim 10, wherein said second activation signal is a signal of a sequence of pulses, said substrate potential detecting means includes a first insulated gate field effect transistor (Q2G) having a gate electrode connected to said semiconductor substrate, said comparing means includes a first node (p2) connected to said first potential generating means, a second node (pl) connected to aid second potential generating means, a second insulated gate field effect transistor (QIG) having a gate electrode for receiving an output of said reference potential generating means, differential amplifying means (Q7G, Q8G, Q11G, Q12G) connected to said first and second nodes, for differentially amplifying potentials on said first and second nodes, means (I1G) for activating said differential amplifying means in response to said second activation signal, and means (Q3G, Q4G, I2G; Q3G, Q4G, 750) for controlling connection/disconnection of said first and second nodes to or from said first and second insulated gate field effect transistors in response to said second activation signal, said control means electrically separating said first and second nodes from said first and second insulated gate field effect transistors when said differential amplifying means is activated, and connecting said first and second nodes to said first and second insulated gate field effect transistors when said differential amplifying means is not activated.

13. The memory device according to claim 12, wherein
said means for activating said differential amplifying means includes means (I1G) for inverting said second activation signal, and
said connection/disconnection control means includes means (I2G, 750, 760) for delaying said second activation signal by a predetermined time.

14. The memory device according to claim 12, wherein
said differential amplifying means includes means (Q5G, Q6G) to be activated in response to said second activation signal, for applying a potential of a predetermined level to both of said first and second nodes, and said predetermined potential level applying means is inactivated in response to activation of said differential amplifying means.

15. The memory device according to claim 13, wherein
said delay means includes
buffer means (760) provided between said first and second nodes and said first and second potential generating means, said buffer means including an inverter (I80, I81, I82, I83), and
flip-flop means (750) to be set in response to an inversion signal of said second activation signal and to be reset in response to an output of the inverter of said buffer means, for disabling said connection/-disconnection means.

16. The memory device according to claim 1, wherein
said reference potential generating means comprises
first capacitor means (C1G) having a first electrode and a second electrode for receiving said second activation signal,
second capacitor means (C3G) having a third electrode and a fourth electrode for receiving an inversion signal of said second activation signal,
a first insulated gate field effect transistor (Q10G) diode-connected and provided between said first capacitor means and a specified region (170) in said semiconductor substrate,
a second insulated gate field effect transistor (Q9G) connected between said second electrode of said first capacitor means and a predetermined potential and having a gate electrode connected to the second electrode of said second capacitor means, and
a third insulated gate field effect transistor (Q11G) diode-connected and provided between the fourth electrode of said second capacitor and said predetermined potential.

17. The memory device according to claim 1, wherein
said second activation signal is a series of pulse signals,
each of said first and second potential generating means comprises
first capacitor means (CM, Cs) having one electrode for receiving said second activation signal and the other electrode,
second capacitor means (CMP, CSP) having one electrode for receiving an inversion signal of said second activation signal and the other electrode, a third insulated gate field effect transistor (Q2M, Q2S) diode-connected and provided between said other electrode of said first capacitor means and said semiconductor substrate,
a fourth insulated gate field effect transistor (Q3M, Q3S) diode-connected and provided between said other electrode of said second capacitor means and a predetermined potential, and
a fifth insulated gate field effect transistor (Q1M, Q1S) provided between said other electrode of said first capacitor means and said predetermined potential and having a gate electrode connected to said other electrode of said second capacitor means.

18. A method of applying a bias voltage to a semiconductor substrate on which a dynamic random access memory with a self-refresh function on memory cell data is formed, comprising the steps of:
generating an internal refresh instruction signal ($\phi_S$) in response to an external refresh instruction signal,
generating a refresh enable signal ($\phi_R$) at a predetermined interval in response to said internal refresh instruction signal;
executing said refresh of memory cell data in response to said refresh enable signal, said execution of refresh being performed while the refresh enable signal remains in activated state; and
applying said bias potential to said semiconductor substrate only during a part of the generation cycle of said refresh enable signal in response to said internal refresh instruction signal and said refresh enable signal.

19. The method of claim 18, wherein
said substrate biasing step includes a step of applying a bias voltage to said semiconductor substrate during a period including the activated state of said refresh enable signal.

20. The method of of claim 18, wherein said substrate biasing step includes a step of applying a bias voltage to said semiconductor substrate only during a part of the time period in which said refresh enable signal is in activated state.

21. The method according to claim 18, wherein
said step of applying the substrate bias includes the steps of
generating a reference potential,
detecting a potential of said semiconductor substrate using a detector having an input of high input impedance, said input of said detector being connected to said semiconductor substrate,
comparing said detected potential of said substrate and said reference potential, and
activating either one, not both of a first and a second bias potential generating circuits based on the result of the comparison, said first and second bias potential generating means having different bias potential supply capabilities with each other.

22. The method according to claim 21, wherein
said comparison and selective activation step comprising the steps of:
generating an activation signal,
generating signals corresponding to said reference potential and said potential of said substrate in response to said activation signal,
differentially amplifying said generated signals in response to said activation signals, and transmitting said activation signal to either one of said first and second bias generating circuits based on the result of the differential amplification.

23. The method of according to claim 21, wherein said comparing and selective activating steps include the steps of
generating an activation signal in pulses,
detecting said generated reference potential,
transmitting said detected reference potential and said potential of said substrate to the first and second nodes,
differentially amplifying potentials of said first and second nodes,
stopping transmission of said reference potential and said potential of said substrate to said first and second nodes in response to said differential amplifying operation,
setting a predetermined potential at said first and second nodes after completion of said differential amplifying operation, and
applying the potentials of said first and second nodes to said first and second bias generating circuits.

24. The method according to claim 18, wherein said substrate bias potential applying step comprises the steps of:
generating a reference potential;
detecting a potential of said semiconductor substrate;
comparing the detected potential with said reference potential; and in response,
applying to said substrate, selectively, one or the other, but not both, of a first, relatively high magnitude source of current and a second, relatively low magnitude source of current to provide bias to said substrate.

* * * * *